(12) United States Patent
Zhang

(10) Patent No.: US 6,495,858 B1
(45) Date of Patent: Dec. 17, 2002

(54) ACTIVE MATRIX DISPLAY DEVICE HAVING THIN FILM TRANSISTORS

(75) Inventor: Hongyong Zhang, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/776,933

(22) Filed: Feb. 7, 2000

Related U.S. Application Data

(60) Continuation of application No. 08/877,307, filed on Jun. 17, 1997, now Pat. No. 6,023,074, which is a division of application No. 08/456,404, filed on Jun. 1, 1995, now Pat. No. 5,650,636.

(30) Foreign Application Priority Data

Jun. 2, 1994 (JP) .............................. 6-145574
Jan. 20, 1995 (JP) .............................. 7-26189
Jan. 26, 1995 (JP) .............................. 7-30115

(51) Int. Cl.[7] .............................................. H01L 29/04
(52) U.S. Cl. ........................... 257/59; 257/72; 257/350; 349/43; 349/44
(58) Field of Search ..................... 257/59, 72, 350, 257/351, 347; 349/43, 44, 42, 139, 140

(56) References Cited

U.S. PATENT DOCUMENTS

| 4,623,908 A | 11/1986 | Oshima et al. |
| 4,938,565 A | 7/1990 | Ichikawa |
| 4,990,981 A | 2/1991 | Tanaka et al. |

(List continued on next page.)

FOREIGN PATENT DOCUMENTS

| EP | 0 376 329 | 3/1990 |
| JP | 62-092370 | 4/1987 |
| JP | 63-151083 | * 6/1988 |

(List continued on next page.)

OTHER PUBLICATIONS

Allowed Claims of application Ser. No. 09/104,990, claims 5–8, 15–59, Jun. 26, 1998, Filed, Active Matrix Display and Electro–Optical Device.
Allowed Claims of application Ser. No. 09/475,245, claims 1–31, Dec. 30, 1999, Filed, Active Matrix Display Having Storage Capacitor Associated with each Pixel Transistor.

(List continued on next page.)

Primary Examiner—Minh Loan Tran
(74) Attorney, Agent, or Firm—Eric J. Robinson; Robinson Intellectual Property Law Office, PC

(57) ABSTRACT

A display device including a plurality of source lines over a substrate, a plurality of gate lines over the substrate extending across the plurality of source lines, and a plurality of pixels over the substrate arranged in a matrix array at intersections of the source lines and gate lines. The pixels comprise at least first and second thin film transistors, whereby one of a source or drain of the first thin film transistor is connected to one of the source lines, and a pixel electrode connected to a source or drain of the second thin film transistor, whereby the first and second thin film transistors are electrically connected in series between the pixel electrode and the one of the source lines. A portion of the one of the source lines covers at least a portion of the first thin film transistor so that (1) the source or drain of the thin film transistor which is connected to the one of the source lines and (2) at least a part of a channel of the first thin film transistor are light shielded while both of (1) the source or drain of the second thin film transistor which is connected to the pixel electrode and (2) a channel of the second thin film transistor, are not covered by any portion of the one of the source lines.

26 Claims, 15 Drawing Sheets

U.S. PATENT DOCUMENTS

| | | |
|---|---|---|
| 5,159,476 A | 10/1992 | Hayashi |
| 5,173,792 A | 12/1992 | Matsueda |
| 5,182,620 A | 1/1993 | Shimada et al. |
| 5,208,690 A | 5/1993 | Hayashi et al. |
| 5,365,079 A | 11/1994 | Kodaira et al. |
| 5,367,392 A | 11/1994 | Janai et al. |
| 5,410,164 A | 4/1995 | Katayama et al. |
| 5,412,493 A | 5/1995 | Kunii et al. |
| 5,515,187 A | 5/1996 | Nakamura et al. |
| 5,576,556 A | 11/1996 | Takemura et al. |
| 5,608,557 A | 3/1997 | Wu |
| 5,614,733 A | 3/1997 | Zhang et al. |
| 5,642,213 A | 6/1997 | Mase et al. |
| 5,650,636 A | 7/1997 | Takemura et al. |
| 5,650,637 A | 7/1997 | Kodaira et al. |
| 5,780,872 A | 7/1998 | Misawa et al. |
| 6,023,074 A * | 2/2000 | Zhang ..................... 257/59 |
| 6,259,117 B1 | 7/2001 | Takemura et al. |
| 6,297,518 B1 | 10/2001 | Zhang |

FOREIGN PATENT DOCUMENTS

| | | |
|---|---|---|
| JP | 02-044317 | 2/1990 |
| JP | 2-89030 | 3/1990 |
| JP | 02-089030 | 3/1990 |
| JP | 2-176724 | 7/1990 |
| JP | 02-176724 | 7/1990 |
| JP | 03-248129 | 11/1991 |
| JP | 03-288824 | 12/1991 |
| JP | 03-293641 | 12/1991 |
| JP | 04-093036 | 3/1992 |
| JP | 04-174822 | 6/1992 |
| JP | 04-219736 | 8/1992 |
| JP | 4-251818 | 9/1992 |
| JP | 04-251818 | 9/1992 |
| JP | 04-333828 | 11/1992 |
| JP | 05-203988 | 8/1993 |
| JP | 05-265042 | 10/1993 |
| JP | 06-082758 | 3/1994 |
| JP | 6-138486 | 5/1994 |
| JP | 06-138486 | 5/1994 |
| JP | 7-20494 | 1/1995 |
| JP | 07-020494 | 1/1995 |

OTHER PUBLICATIONS

Okumura et al., "Dynamic Leakage Current Reduction Poly–Si TFTs for AMILCDS", Nov. 30–Dec. 1, 1994, pp. 24–27, AM–LCD 94, Digest of Technical Papers, 1994 International Workshop on Active–Matrix Liquid–Crystal Displays, Kogahuin University.

* cited by examiner

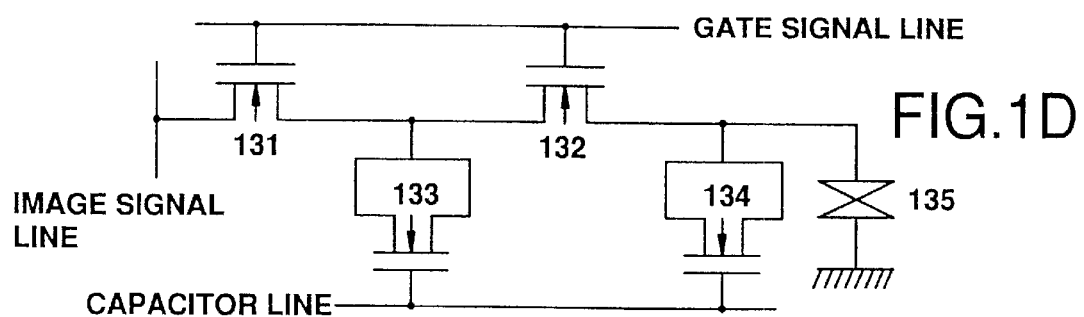
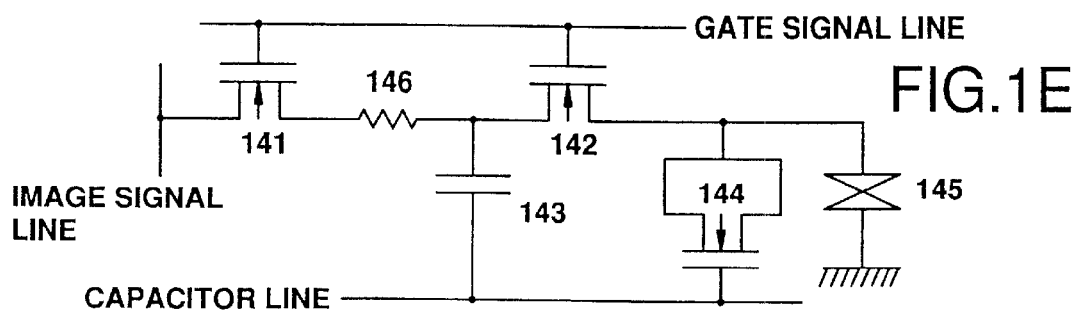

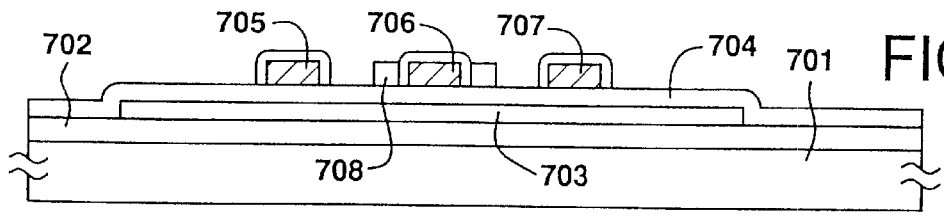
FIG.10A
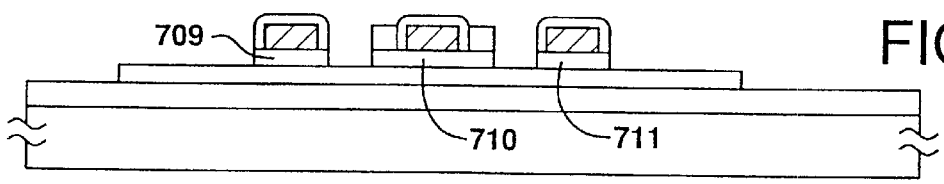
FIG.10B
FIG.10C
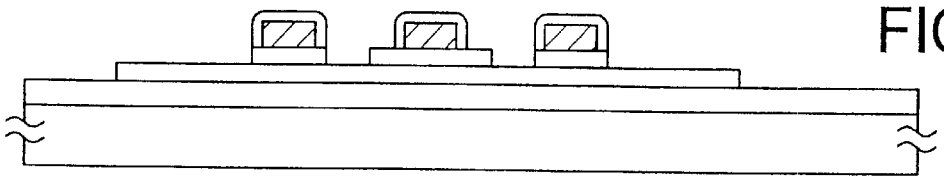
FIG.10D
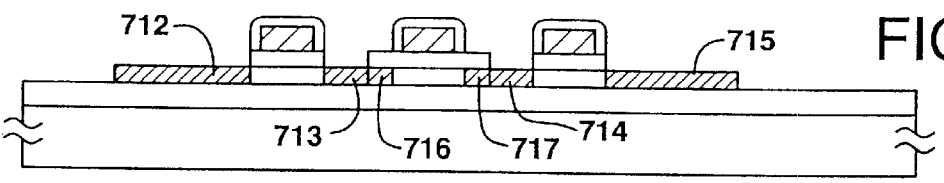
FIG.10E
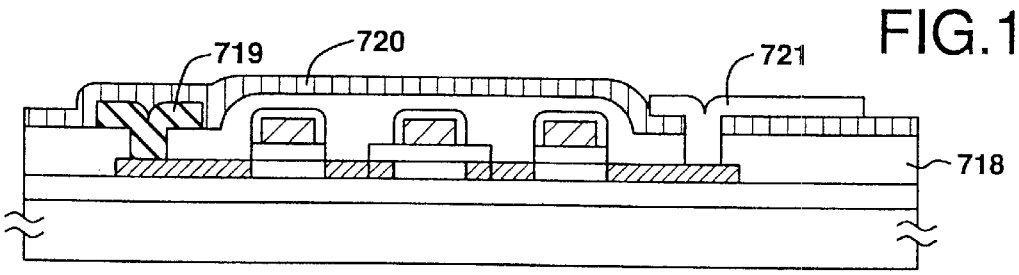
FIG.10F
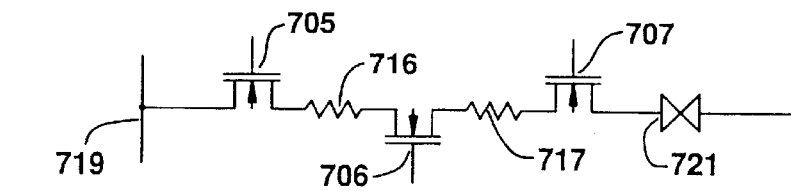

ACTIVE MATRIX DISPLAY DEVICE HAVING THIN FILM TRANSISTORS

This is a continuation of Ser. No. 08/877,307, filed on Jun. 17, 1997, now U.S. Pat. No. 6,023,074 which is a divisional application of Ser. No. 08/456,404 filed, Jun. 1, 1995, now U.S. Pat. No. 5,650,636.

BACKGROUND OF THE INVENTION

1. Field of the Invention

The present invention relates to an active matrix display construction and, more particularly, to a circuit and device structure for improving the quality of the image displayed on the viewing screen.

2. Description of the Related Art

FIG. 2(A) schematically shows a conventional active matrix display. In this figure, the region 204 surrounded by the broken line is a display region. Thin-film transistors 201 (only one is shown) are arranged in rows and columns in this region 204. Conductive interconnects connected with the source electrodes of the thin-film transistors 201 are image signal lines or data signal lines 206. Conductive interconnects connected with the gate electrodes of the thin-film transistors 201 are gate-selecting signal lines 205 (only one is shown).

We now take notice of driver devices. The thin-film transistors 201 act to switch data, and drive a liquid-crystal cell 203. Auxiliary capacitors 202 (only one is shown) are used to reinforce the capacitance OF the liquid-crystal cell, and act to hold image data. The thin-film transistors 201 are employed to switch image data indicated by the voltage applied across the liquid-crystal material. Let $V_{GS}$ be the gate voltage of each thin-film transistor. Let $I_D$ be the drain current. The relation $V_{GS} – I_D$ is shown in FIG. 3. In particular, if the gate voltage $V_{GS}$ is in the cutoff region of the thin-film transistor, the drain current $I_D$ is increased, and it is called OFF current.

In the case of an N-channel thin-film transistor, the OFF current flowing when the gate voltage $V_{GS}$ is biased negatively is stipulated by the current flowing through a PN junction formed between a P-type layer and an N-type layer. The P-type layer is induced in the surface of the thin-film semiconductor. The N-type layer is formed in the source and drain regions. Because numerous traps exist in the thin-film transistor, this PN junction is incomplete and so the junction tends to produce a leakage current. As the gate electrode is biased more negatively, the OFF current is increased, for the following reason. The concentration of carriers in the P-type layer formed in the surface of the thin-film semiconductor is increased, thus reducing the width of the energy barrier in the PN junction. As a result, the electric field is concentrated, so that the current leaking from the junction increases.

The OFF current produced in this way depends greatly on the source/drain voltage. For example, it is known that as the voltage applied between the source and drain of a thin-film transistor is increased, the OFF current is increased drastically. That is, the OFF current produced when a voltage of 10 V is applied is not merely twice as large as the OFF current produced when a voltage of 5 V is applied between the source and drain. Rather, the ratio of the former OFF current to the latter OFF current reaches 10 or even 100. This nonlinearlity also depends on the gate voltage. Generally, where the reverse bias applied to the gate electrode is large (in the case of an N-channel type, a large negative voltage), the ratio is large.

In an attempt to solve this problem, the multi-gate method has been proposed as described in Japanese Patent Publication Nos. 44195/1993 and 44196/1993. In this method, thin-film transistors are connected in series. This method is intended to reduce the OFF current of each individual thin-film transistor, by reducing the voltage applied between the source and drain of each thin-film transistor. For example, where two-thin-film transistors are connected in series as shown in FIG. 2(B), the voltage applied between the source and drain of each thin-film transistor is halved. This reduces the OFF current by a factor of 10 or even 100 because of the principle described above.

TFTS, source lines, and gate lines are formed in an active matrix circuit. These elements hinder transmission of light. Specifically, the ratio (aperture ratio) of the area of the region that can be used for image display to the whole area is small. Typically, the aperture ratio is 30 to 60%. Especially, in a backlit display device. comprising an active matrix circuit backlit with intense light, if the aperture ratio is small, a major portion of the incident light is absorbed by TFTs and by the liquid-crystal material and so these TFTs and liquid-crystal material get hot. As a result, their characteristics are deteriorated.

However, as the image displayed on a liquid crystal display is required to have stricter characteristics, it is more difficult to reduce the OFF current by a required amount by the aforementioned multi-gate method. In particular, if the number of the gate electrodes (or, the number of thin-film transistors) is increased to 3, 4, and 5, then the voltage applied between the source and drain of each TFT decreases to one-third, one-fourth, and one-fifth, respectively. In this way, the latter voltage does not decrease rapidly. Therefore, in order to reduce the voltage between the source and drain by a factor of 100, as many as 100 gates are needed. That is, in this method, the resulting advantage is most conspicuous where the number of gates is two. However, if more gates are provided, great advantages cannot be expected.

SUMMARY OF THE INVENTION

In view of the foregoing problems, the present invention has been made.

It is an object of the invention to provide a pixel circuit which reduces the voltage applied between the source and drain of each TFT (thin-film transistor) connected with a pixel electrode down to a level which is about less than one-tenth, preferably less than one-hundredth, of the level normally obtained, thus reducing the OFF current. This pixel circuit is characterized in that the number of TFTs used for the above-described object is reduced sufficiently. Preferably, the number of the TFTs is less than 5, more preferably 3.

It is another object of the invention to provide an active matrix display comprising TFTs which are prevented from being irradiated with light without lowering the aperture ratio.

The theory underlying the inventive concept is illustrated in FIG. 2(C), where TFTs (thin-film transistors) 221 and 222 are connected in series. A capacitor 223 is inserted between these TFTs 221 and 222 to lower the voltage produced between the source and drain of the TFT 222 especially located on the side of a pixel electrode. This reduces the OFF current of the TFT 222. The illustrated capacitor 224 is not always necessary. Rather, this capacitor 224 increases the burden-imposed during writing. Therefore, if the ratio of the capacitance of a pixel cell 225 to the capacitance 223 is appropriate, then it may be desired to dispense with the capacitor 224.

The operation is next described in detail. When a select signal is sent to a gate signal line 226, both TFTs 221 and 222 are turned ON. Depending on the signal on an image signal line 227, the capacitors 223, 224 and the pixel cell 225 are electrically charged. When they are fully charged, i.e., when a balanced state is obtained, the voltage applied to the source of the TFT 222 is substantially equal to the voltage applied to the drain of the TFT 222.

Under this condition, if the select signal is made to cease, both TFTs 221 and 222 are turned OFF. Then, a signal for other pixel is applied to the image signal line 227. The TFT 221 produces a finite amount of leakage current. Consequently, the electric charge stored in the capacitor 223 is released, so that the voltage drops but at a rate roughly equal to the rate at which the voltage developed across the capacitor 202 of the normal active matrix circuit shown in FIG. 2(A) drops.

On the other hand, with respect to the TFT 222, the voltage developed between the source and drain is initially almost zero. For this reason, the OFF current is quite weak. Then, the voltage developed across the capacitor 223 drops. Therefore, the voltage between the source and drain increases gradually. This, in turn, increases the OFF current. Obviously, increases in the OFF current lower the voltage developed across the pixel cell 225 sufficiently more mildly than in the case of the normal active matrix circuit shown in FIG. 2(A).

For example, it is assumed that the TFTs 201 and 221 have similar characteristics and that the voltage developed across the capacitor 202 changes from 10 V to 9, V or 90%, during one frame. In the case illustrated in FIG. 2(A), the voltage developed across the pixel cell 203 drops down to 9 V during one frame. However, in the case illustrated in FIG. 2(C), even if the voltage developed across the capacitor 223 drops to 9, V the OFF current is quite small because the voltage between the source and drain of the TFT 222 is 1 V. This holds true when one frame ends. Consequently, the accumulated amount of electric charge released from the pixel cell 225 and from the capacitor 224 is quite small. Hence, the voltage developed across the pixel cell 225 is substantially maintained at 10 V.

It is not easy to compare the case illustrated in FIG. 2(A) with the case illustrated in FIG. 2(B). In FIG. 2(B), the voltage applied between the source and drain of one TFT is half (or 5 V) of the voltage (10 V) applied in the case of FIG. 2(A). It is unlikely that the voltage between the source and drain is 1 V, unlike the case of TFT 222 shown in FIG. 2(C). This is one advantage of the present invention.

If LDD regions or offset regions are inserted in the channels of the TFTs 221 and 222, then these regions form drain resistors and source resistors, respectively. This mitigates the electric field strength at the drain junction. Obviously, this reduces the OFF current further.

If a combination of TFTs and capacitors is added as shown in FIG. 2(D), then greater effect can be produced. However, the rate at which the effect is increased is lower than in the case in which the configuration shown in FIG. 2(A) is replaced by the configuration shown in FIG. 2(C).

In the above-described structure, the capacitors 223 and 224 can be ordinary capacitors. If one or both of them are MOS capacitors, then integration can be accomplished more efficiently. As mentioned previously, the capacitor 224 is not always necessary. If a lightly doped region is formed between the TFTs 221 and 222 to form a circuit configuration in which a resistor is inserted in series, then the OFF current can be reduced further.

Each capacitor consists of a fixed capacitor comprising two opposite metal electrodes. Instead, each capacitor may consist of a MOS capacitor formed by laminating a gate-insulating film and a gate electrode on a substantially intrinsic semiconductor film. The MOS capacitor is characterized in that the capacitance is varied by the potential at the gate electrode.

In one example of the MOS capacitor, three or more TFTs are connected in series with each one pixel electrode. At least one of them excluding those of the series connected TFTs which are located at opposite ends is maintained in conduction and used as a capacitor. In another example, a MOS capacitor is connected to the junction of the drain of one of the TFTs connected in series and the source of the other TFT. A stable electrostatic capacitance is obtained by maintaining the gate electrode of the MOS capacitor at an appropriate potential.

The present invention is characterized in that source lines are formed so as to cover channels in TFTs. The TFTs can be the top gate type obtained by forming a thin-film semiconductor region, gate lines (gate electrodes), an interlayer insulator, and source lines in this order. Alternatively, the TFTs can be the bottom gate type obtained by forming gate lines (gate electrodes), a thin-film semiconductor region, an interlayer insulator, and source lines in this order. It is to be noted that an ordinary active matrix circuit using bottom gate TFTs has no interlayer insulator. In the present invention, however, an interlayer insulator is needed to provide insulation between channel and source lines.

FIGS. 21 and 22 show conventional arrangements of TFTs in active matrix circuits. Gate lines 19 (only one is shown) and source lines 21 (only one is shown) are arranged so as to cross each other substantially at right angles. Branch lines 20 (only one is shown) extend from the gate lines and are made to overlap thin-film semiconductor regions. Thus, the branch lines 20 are used as gate electrodes of TFTs. At one end of each thin-film semiconductor region, a pixel electrode 22 and a contact 25 are formed. At the other end, a source line and a contact 24 are formed.

That portion of each thin-film semiconductor region which substantially overlaps the gate line is a channel 23. As shown in FIGS. 21 and 22, the channel 23 is widely spaced from the source line 21. The branch line 20 from the gate line increases the area occupied by the TFT, thus deteriorating the aperture ratio.

In the present invention, any structure corresponding to the branch line 20 is not formed. A channel is formed under a source line. This reduces the area occupied by the TFT. Also, the aperture ratio can be enhanced. The channel in a TFT is easily affected by light. Therefore, the whole TFT is normally enclosed. Furthermore, a light-shielding film is formed. This further lowers the aperture ratio. In the present invention, a source line is formed so as to cover the channel, thus shielding the channel from extraneous light. Consequently, it is not necessary to form a light-shielding film. This is quite effective in enhancing the aperture ratio.

The active matrix circuit of this construction is quite advantageously used for a backlit display device. As described above, a backlit display device is required to have a high aperture ratio. In addition, the device is illuminated with intense light. Hence, it is imperative that TFTs be shielded from light. In the present invention, light is projected from above source lines. This assures that the source lines shield the channels in the TFTs from light.

Other objects and features of the invention will appear in the course of the description thereof, which follows.

BRIEF DESCRIPTION OF THE DRAWINGS

FIGS. 1(a)–1(e) are fragmentary circuit diagrams of active matrix circuit devices according to the invention;

FIGS. 10(A)–10(E) are cross-sectional views of active matrix circuit devices, illustrating the process sequence of a further method of fabricating the circuit devices according to the invention;

FIG. 10(F) is a circuit diagram of an active matrix circuit according to the invention;

DETAILED DESCRIPTION OF THE PREFERRED EMBODIMENTS

EXAMPLE 1

Figure 1A:
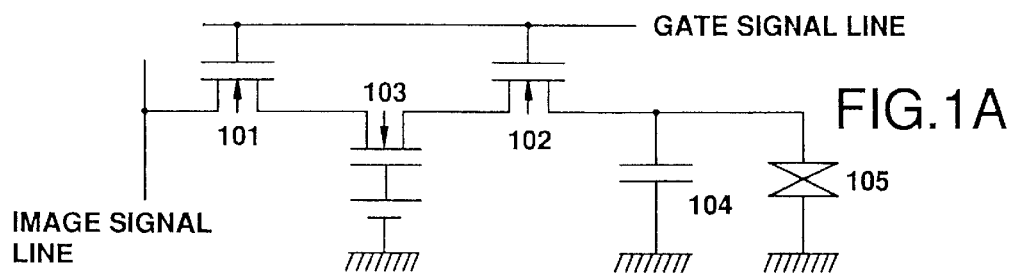

FIG. 1(a) shows an active matrix display device in which three thin-film transistors (TFTS) are connected with one electrode of one pixel cell 105. All of these TFTs are of the N-channel type. The TFTs can also be of the P-channel. type. Where each TFT uses a crystalline silicon semiconductor formed by a low-temperature process, the P-channel type produces smaller OFF current and is deteriorated less easily than the N-channel type.

Two TFTs 101 and 102 share gate interconnects and are connected with a gate signal line. The source of the TFT 101 is connected with an image signal line. A further TFT 103 which is maintained in conduction is connected between the two TFTs 101 and 102. In order to maintain the TFT 103 in conduction, it is desired to apply a sufficiently high positive potential to the gate so that the TFT 103 is hardly affected by image signal or other signal.

For example, where the image signal varies from −10 V to +10 V, the gate of the TFT is maintained above +15 V, preferably above +20 V. For instance, if the potential at the gate of the TFT 103 is +11 V, the potential difference between the gate and source varies around the threshold voltage, i.e., from +1 V to +11 V. Also, the capacitance obtained by the TFT 103 varies greatly. On the other hand, if the potential at the gate of the TFT 103 is +20 V, the potential difference between the gate and the source varies from +10 V to +30 V but sufficiently remote from the threshold voltage. Therefore, the capacitance obtained by the TFT 103 hardly varies.

The liquid crystal cell 105 and an auxiliary capacitor 104 are connected with the drain of the TFT 102. The other electrode of the liquid crystal cell 105 and the other electrode of the auxiliary capacitor 104 are grounded. If the capacitance of the liquid crystal cell 105 is sufficiently large, the auxiliary capacitor 104 can be dispensed with. The ratio of the capacitance of the MOS capacitor 103 to the sum of the capacitance of the auxiliary capacitor 104 and the capacitance of the liquid crystal cell 105 is determined optimally.

The operation of the configuration shown in FIG. 1(a) is now described. A high-level voltage is applied to the gates of two TFTs 101 and 102, thus turning them ON. An electrical current corresponding to an image signal flows through the source of the TFT 101. The TFT 103 which is maintained in conduction and connected with the drain of the TFT 101 acts as a capacitor and starts charging. Since the TFT 103 is held in conduction, an electrical current flows from the source of the TFT 102 to the drain, thus electrically charging the auxiliary capacitor 104 and the liquid crystal cell 105.

Figure 6:
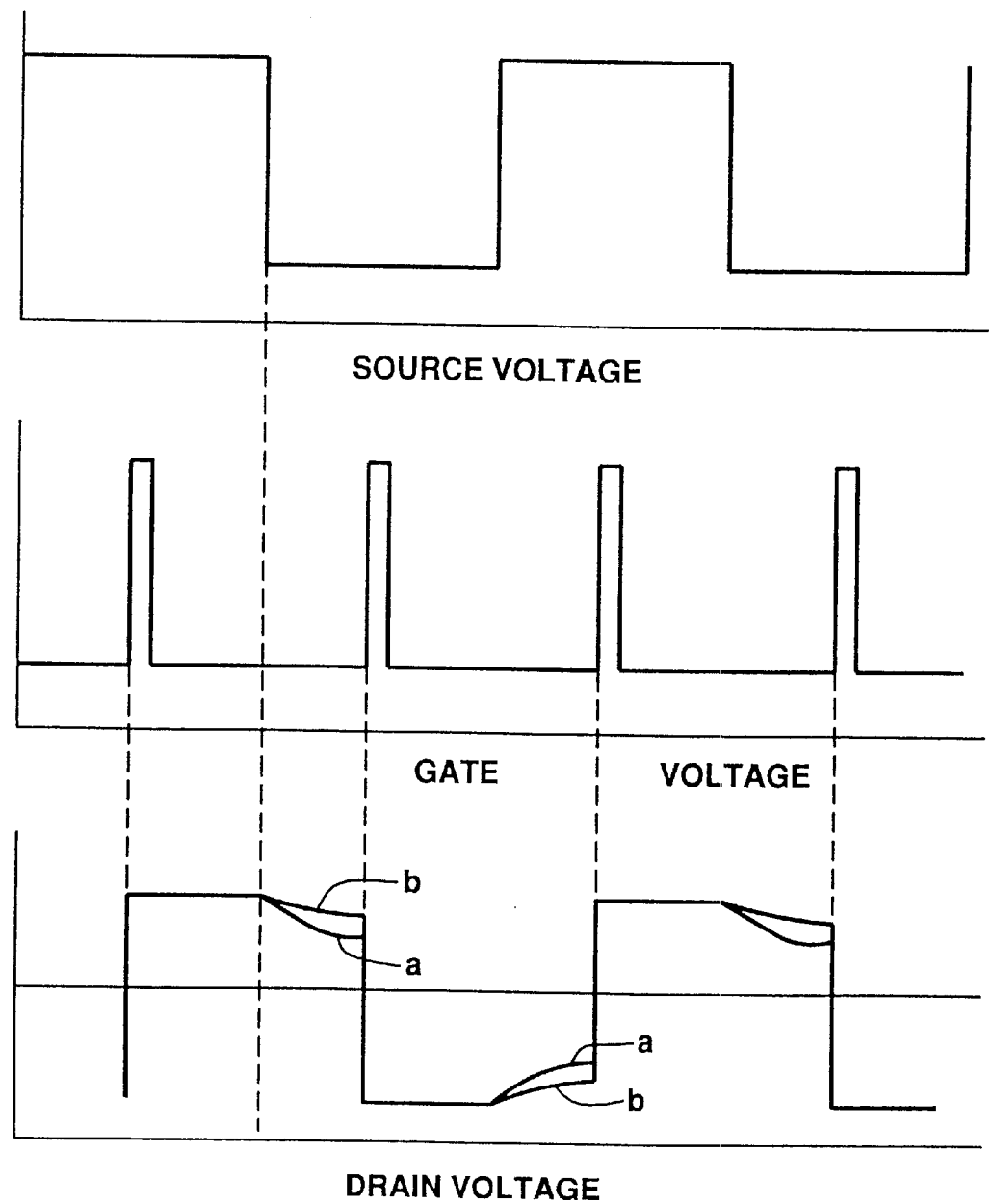
FIG. 6 is a diagram illustrating the manner in which an active matrix circuit device according to the invention is driven.

Then, if a low-level voltage is impressed on the gates of the TFTs 101 and 102, they are biased into cutoff. The voltage developed across the source of the TFT 101 drops, so that an OFF current flows through the TFT 103 which is kept in conduction. Thus, electrical discharging is started. However, the capacitance of the invariably conducting TFT 103 delays the drop of the voltage between the drain and source of the TFT connected to the pixel. Consequently, the amount of electric charge released from the auxiliary capacitor 104 and from the liquid crystal cell 105 decreases. The amount of electric charge released from the liquid crystal cell 105 is suppressed until the TFT is driven into conduction during the next frame of image. The drain voltage varied in this way is indicated by curve (a) in FIG. 6.

Referring again to FIG. 1(a), we now discuss a circuit in which the invariably conducting N-channel TFT 103 has been omitted. The two N-channel TFTs 101 and 102 share the gate interconnects. The liquid crystal cell 105 and the auxiliary capacitor 104 are connected to the drain of the TFT 102. This is the circuit shown in FIG. 2(B) and known as a so-called multi-gate circuit.

A high-level voltage is first applied to the gate electrodes of the two TFTs 101 and 102, thus turning them ON. An electrical current flows through the sources of the TFTS, so that the auxiliary capacitor 104 and the liquid crystal cell 105 are electrically charged.

Then, a low-level voltage is applied to the gates of the TFTs 101 and 102. As a result, the TFTs 101 and 102 are biased into cutoff. The voltage developed across the source of the TFT 101 drops. This lowers the voltage at the drain of the TFT 102. Consequently, the auxiliary capacitor 104 and the liquid crystal cell 105 start to electrically discharge. The drain voltage varied in this way is indicated by curve (b) in FIG. 6. The amount of electric charge released is greater than the amount of electric charge released in the case indicated by curve (a). Also, the voltage drop is greater.

The present example demonstrates the usefulness of the present invention. Obviously, if a TFT similar to the TFTs 102 and 103 is inserted between TFTs 192 and 104, greater advantages can be obtained, in the same way as in the configuration shown in FIG. 2(D).

EXAMPLE 2

Figure 1B:
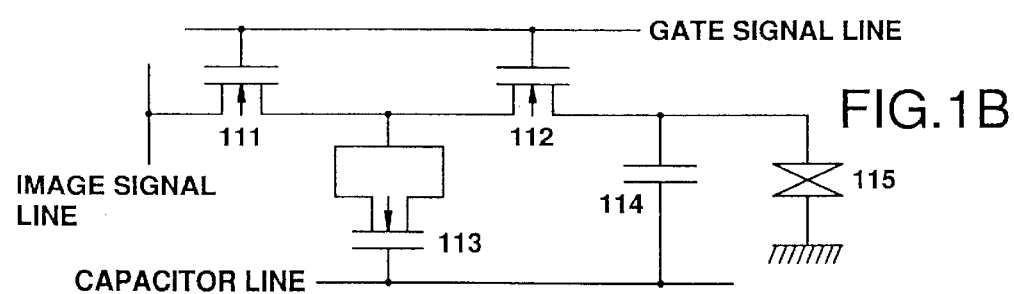

FIG. 1(b) shows an example of pixel of an active matrix circuit in which two TFTs are connected with one pixel electrode. All of the TFTs are of the N-channel type. Similar advantages can be obtained if they are of the P-channel type.

Two TFTs 111 and 112 share gate interconnects and are connected with a gate signal line. A MOS capacitor 113 is connected between the source and. drain of each TFT. The MOS capacitor 113 may be formed by shorting the source of an ordinary TFT to the drain. Since the MOS capacitor uses an N-channel TFT, if the gate is maintained at an appropriate positive potential, the MOS capacitor acts as a capacitor. In order that the MOS capacitor function stably, the potential is preferably maintained at a sufficiently high potential, in the same way as the gate of the TFT 103 of Example 1.

In order to implement the present invention, it is necessary that the gate of the MOS capacitor 113 be maintained at the aforementioned potential for a major portion of the time during which the pixel of interest is not selected. When the pixel is selected, i.e., a signal appearing on the image signal line is being written to the pixel, the gate of the MOS capacitor 103 is preferably maintained at the potential described above. The capacitor 114 and the gate electrode of the MOS capacitor 113 are connected with a capacitor line extending parallel to the gate signal line, and are maintained at the potential for the above-described purpose.

The liquid crystal cell 115 and the auxiliary capacitor 114 are connected with the drain of the TFT 112. The source of the TFT 111 is connected with the image signal line. If the capacitance of the liquid crystal cell 115 is sufficiently large, the auxiliary capacitor 114 is unnecessary.

The operation of the configuration shown in FIG. 1(b) is now described. For simplicity, it is assumed that the gate of the MOS capacitor 113 is maintained at a sufficiently high positive potential. First, a high-level voltage is applied to the gates of two TFTs 111 and 112, thus biasing them into conduction.

As a result, an electrical current flows through the source of the TFT 111. The MOS capacitor 113 connected with the drain of the TFT 111 is started to be electrically charged. An electrical current flows from the source electrode of the TFT 112 to the drain current, thus electrically charging the auxiliary capacitor 114 and the liquid crystal cell 115.

Thereafter, a low-level voltage is applied to the gate electrodes of the TFTs 111 and 112, so that these TFTs are turned off. The voltage at the source electrode of the TFT 111 drops. The OFF current from the TFT starts to electrically charge the MOS capacitor 113. However, the MOS capacitor 113 delays the drop of the voltage developed between the drain and source of the TFT connected with the pixel. The amount of electric charge released from the auxiliary capacitor and from the liquid crystal cell 115 is reduced. The amount of electric charge released from the liquid crystal cell 115 is suppressed until the TFT is driven into conduction during the next frame of image. The waveforms of the signals produced during this operation are the same as the waveform produced in Example 1.

EXAMPLE 3

Figure 1C:
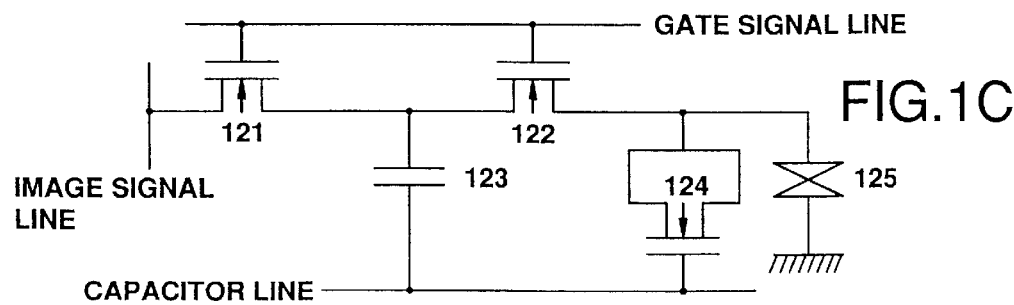

FIG. 1(c) shows an example of pixel of an active matrix circuit in which two TFTs are connected with one pixel electrode. All of the TFTs are of the N-channel type. Similar advantages can be obtained if they are of the P-channel type.

Two TFTs 121 and 122 share gate interconnects and are connected with a gate signal line. A capacitor 123 is connected between the source and drain of each TFT.

The auxiliary capacitor 124 is formed, using a MOS capacitor. In particular, the auxiliary capacitor 124 is formed by shorting the source of an ordinary TFT to the drain, in the same way as in the case of the MOS capacitor 113 of Example 2. Since this MOS capacitor is composed of an N-channel TFT, if the gate is maintained at an appropriate positive potential, then the N-channel TFT acts as a capacitor. In order that the N-channel TFT act as a capacitor stably, the gate is preferably maintained at a sufficiently high positive potential, in the same way as in the gate of the MOS capacitor 113 of Example 2.

In order to implement the present invention, it is necessary that the gate of the MOS capacitor 124 be maintained at the aforementioned potential at least for a major portion of the time during which the pixel of interest is not selected. When the pixel is selected, i.e., a signal appearing on the image signal line is being written to the pixel, the gate of the auxiliary capacitor 124 is preferably maintained at the potential described above. The capacitor 123 and the gate electrode of the MOS capacitor 124 are connected with a capacitor line extending parallel to the gate signal line, and are maintained at the potential for the above-described purpose.

The liquid crystal cell 125 and the auxiliary capacitor 124 are connected with the drain of the TFT 122. The source of the TFT 121 is connected with the image signal line. The circuit devices constructed in this way operate in the same way as in Examples 1 and 2.

EXAMPLE 4

FIG. 1(d) shows an example of pixel of an active matrix circuit in which two TFTs are connected with one pixel electrode. All of the TFTs are of the N-channel type. Similar advantages can be obtained if they are of the P-channel type.

Two TFTs 131 and 132 share gate interconnects and are connected with a gate signal line. A capacitor 133 is connected between the source and drain of each TFT. This auxiliary capacitor 133 is formed by shorting the source of an ordinary TFT to the drain, in the same way as in the case of the MOS capacitor 113 of Example 2.

In the present example, the auxiliary capacitor 134 is formed, also using a MOS capacitor. Since these MOS capacitors are N-channel TFTs, if the gates are maintained at an appropriate positive potential, then the N-channel TFTs act as capacitors. In order that the N-channel.TFTs act as capacitors stably, the gates are preferably maintained at a sufficiently high positive potential, in the same way as in the gate of the MOS capacitor 113 of Example 2. In order to implement the present invention, it is necessary that the gates of these MOS capacitors be maintained at the aforementioned potential at least for a major portion of the time during which the pixel of interest is not selected.

When the pixel is selected, i.e., a signal appearing on the image signal line is being written to the pixel, the gates of the auxiliary capacitors are preferably maintained at the potential described above. The gate electrodes of the MOS capacitors 133 and 134 are connected with a capacitor line extending parallel to the gate signal line, and are maintained at the potential used for the above-described purpose.

The liquid crystal cell 135 and the auxiliary capacitor 134 are connected with the drain of the TFT 132. The source of the TFT 131 is connected with the image signal line. The circuit devices constructed in this way operate in the same way as in Examples 1–3.

EXAMPLE 5

FIG. 1(e) shows an example of pixel of an active matrix circuit in which two TFTs are connected with one pixel electrode. All of the TFTs are of the N-channel type. If they are of the P-channel type, similar advantages can be had.

Two TFTs 141 and 142 share gate interconnects and are connected with a gate signal line. A capacitor 143 is connected between the source and drain of each TFT. In order to reduce the OFF current further, a resistor 146 is directly inserted between the TFTs 141 and 142. This resistor 146 may be formed by forming a lightly doped region in a semiconductor film constituting the TFTs 141 and 142.

The auxiliary capacitor 144 is formed, using a MOS capacitor, in the same way as in Example 3. Since the MOS capacitor consists of an N-channel TFT in the same way as in Example 3, if the gate is maintained at an appropriate positive potential, then the N-channel TFT acts as a capacitor. In order that the N-channel TFT act as a capacitor stably, the potential is preferably maintained at a sufficiently high positive potential, in the same way as the gate of the MOS capacitor 123 of Example 3. In order to implement the present invention, it is necessary that the gate of the MOS capacitor 144 be maintained at the aforementioned potential at least for a major portion of the time during which the pixel of interest is not selected.

When the pixel is selected, i.e., a signal appearing on the image signal line is being written to the pixel, the gate of the auxiliary capacitor 144 is preferably maintained at the potential described above. The gate electrodes of the MOS capacitors 143 and 144 are connected with a capacitor line extending parallel to the gate signal line, and are maintained at the potential used for the above-described purpose.

The liquid crystal cell 145 and the auxiliary capacitor 144 are connected with the drain of the TFT 142. The source of the TFT 141 is connected with the image signal line. The circuit devices constructed in this way operate in the same way as in Examples 1–4.

EXAMPLE 6

The present example relates to the process sequence for fabricating the circuits of Examples 1–4. In the present example, a gate electrode is anodized to form an offset gate. This reduces the OFF current. Techniques for anodizing the gate electrode are disclosed in Japanese Patent Laid-Open No. 267667/1993.

FIGS. 4(A)–4(D) illustrate the process sequence of the present example. First, silicon oxide was deposited as a buffer film 402 having a thickness of 1000 to 3000 Å, e.g., 3000 Å, on a substrate 401 consisting of Corning 7059 glass. The substrate 401 measured 100 mm×100 mm. To deposit the silicon oxide film, TEOS was decomposed and deposited by plasma-assisted CVD. This manufacturing step may also be carried out by sputtering techniques.

Then, an amorphous silicon film having a thickness of 300 to 1500 Å, e.g., 500 Å, was formed by plasma-assisted CVD or LPCVD. The laminate was allowed to stand in an ambient maintained at 550 to 600° C. for 8 to 24 hours to crystallize the amorphous film. At this time, a trace amount of nickel may be added to promote the crystallization. Techniques for lowering the crystallization temperature and for shortening the crystallization time are disclosed in Japanese Patent Laid-Open No. 244104/1994.

This fabrication step may be carried out by the use of optical annealing relying on laser irradiation. A combination of thermal annealing and optical annealing can also be utilized. The silicon film crystallized in this way was etched to form island regions 403. A gate-insulating film 404 was formed on these island regions 403. In the present example, a silicon oxide film having a thickness of 700 to 1500 Å, e.g., 1200 Å, was formed by plasma-assisted CVD. This fabrication step may also be carried out by sputtering techniques.

Thereafter, an -aluminum film containing 1% by weight of Si or 0.1–0.3% by weight of Sc and having a thickness of 1000 Å to 3 $\mu$, e.g., 5000 Å, was formed by sputtering. This film was etched to form gate electrodes 405, 406, and 407 (FIG. 4(A)).

Subsequently, an electrical current was passed through the gate electrode within an electrolytic solution to anodize it. In this way, an anodic oxide film having a thickness of 500 to 2500 Å, e.g., 2000 Å, was formed. The used electrolytic solution was obtained by diluting L-tartaric acid with ethylene glycol to a concentration of 5% and adjusting the pH to 7.0±0.2 with ammonia. The laminate was immersed in this solution. The positive terminal of a regulated current source was connected with the gate electrode on the substrate. A platinum electrode was connected with the negative terminal. A voltage was applied while maintaining the current at 20 mA. The oxidation was continued until the voltage reached 150 V. Then, the oxidation was continued while maintaining the voltage at 150 V until the current dropped below 0.1 mA. As a result, an aluminum oxide film, 408, 409, and 410, having a thickness of 2000 Å was obtained.

Then, an impurity (phosphorus, in this example) was implanted into the island region 403 by self-aligned ion doping techniques, using the gate electrode portion (the gate electrode and surrounding anodic oxide film portions) as a mask. Phosphine ($PH_3$) was used as a dopant gas. In this case, the dose was $1 \times 10^{14}$ to $5 \times 10^{15}$ atoms/cm$^2$. The accelerating voltage was 60 to 90 kV. The dose was $1 \times 10^{15}$ atoms/cm$^2$. The accelerating voltage was 80 kV. As a result, N-type doped regions 411–114 were formed (FIG. 4(B)).

The laminate was irradiated with KrF excimer laser light having a wavelength of 248 nm and a pulse width of 20 nsec to activate the doped regions 411–114. The energy density of the laser light was 200 to 400 mJ/cm$^2$, preferably 250 to 300 mJ/cm$^2$. This fabrication step may make use of thermal annealing. Where a catalytic element such as nickel is contained, the doped regions can be activated by thermal annealing at a lower temperature than in normal process, as described in Japanese Patent Laid-Open No. 267989/1994.

The N-type doped regions were formed in this way. In the present example, the doped regions were remoter from the gate electrode by a distance equal to the thickness of the anodic oxide. That is, an offset gate was formed.

Then, silicon oxide was formed as an interlayer insulator 415 having a thickness of 5000 Å by plasma-assisted CVD. At this time, TEOS and oxygen were used as gaseous raw materials. The interlayer insulator 415 and the gate-insulating film 404 were etched. Contact holes were formed in the N-type doped region 411. Then, an aluminum film was formed by sputtering techniques. The aluminum film was etched to form source electrodes and interconnects, 416. These are extensions to image signal lines (FIG. 4(C)).

Thereafter, a passivation film 417 was formed. In this example, a silicon nitride film was grown as the passivation film to a thickness of 2000 to 8000 Å, e.g., 4000 Å, by plasma-assisted CVD, using a mixture gas of $NH_3$, $SiH_4$, and $H_2$. The passivation film 417, the interlayer insulator film 415, and the gate-insulating film 404 were etched to form holes over the anodic oxide film 409. Contact holes for connection with pixel electrodes were formed in the N-type doped region 414. Then, indium tin oxide (ITO) was sputtered as a film. This ITO film was etched to form a pixel electrode 418.

The pixel electrode 418 was located on the opposite side of the anodic oxide film 409 from the gate electrode 406. Thus, a capacitor 419 was created. If the N-type doped regions 412 and 413 are maintained at the same potential, a MOS capacitor is created between the gate electrode 406 and the underlying silicon semiconductor, the MOS capacitor using the gate-insulating film 404 as a dielectric (FIG. 4(D)).

An active matrix circuit devices having the N-channel TFTs 421, 422, capacitors 419, 420 were formed. In the present example, the pixel electrodes cooperate with the gates of the MOS capacitors to form capacitors and so the circuit is the same as the circuits shown in FIGS. 1(a) and 1(b).

Figure 3A:
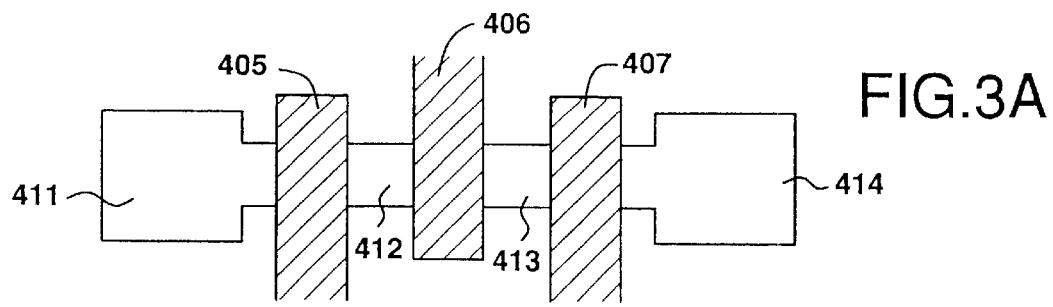
FIGS. 3(A)–3(D) are diagrams illustrating arrangements of semiconductor regions and gates according to the invention.
Figure 3B:
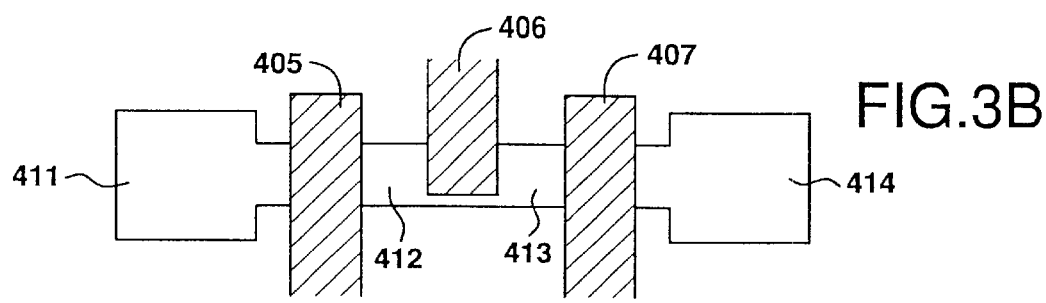
Figure 3C:
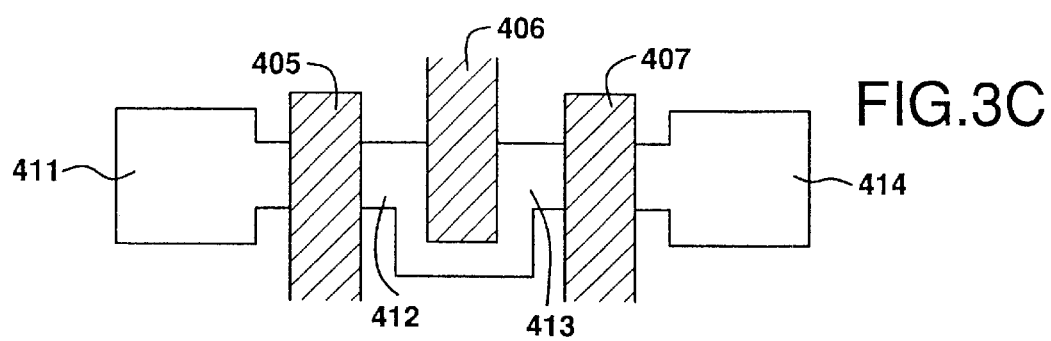
Figure 3D:
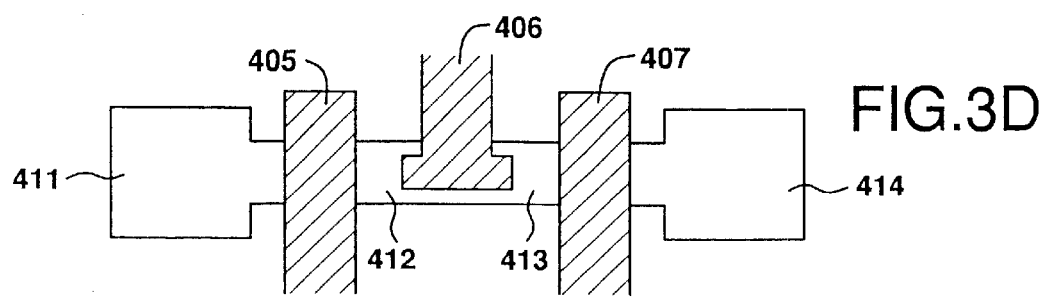

FIGS. 4(A)–4(F) are cross-sectional views. FIGS. 3(A)–3(D) are top views of the structures shown in these cross sections. In the present example, if the gate electrode intersects the island region 403 as shown in FIG. 3(A), a TFT is formed by the gate 406. On the other hand, if the gate 406 does not cross the island region 403 as shown in FIGS. 3(B)–3(D), then a MOS capacitor is formed.

In any case, a channel can be induced in the substantially intrinsic semiconductor region located under the gate electrode, by placing the gate electrode 406 at an adequate potential. As a result, a capacitor is created. In the case of the circuit configuration shown in FIG. 3(A), the resistive component of the channel is inserted in series with two TFTs which are located on opposite sides of the channel.

Figure 4A:
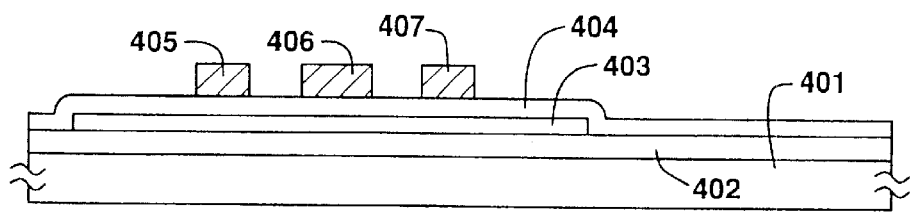
FIGS. 4(A)–4(F) are cross-sectional views of active matrix circuit devices according to the invention, illustrating the process sequence of a method of fabricating the circuit devices.
Figure 4B:
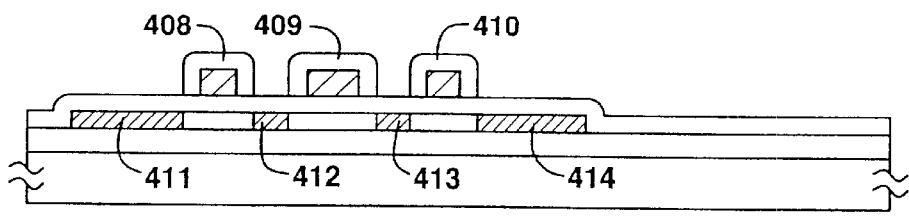
Figure 4C:
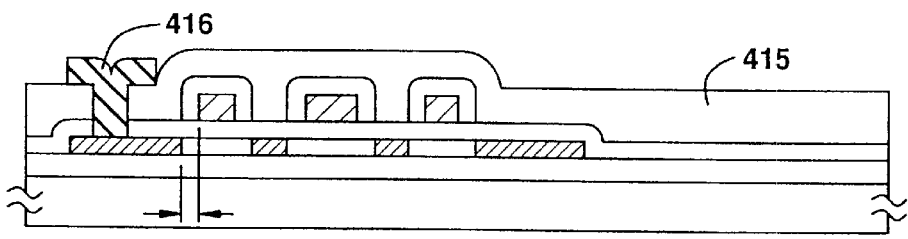
Figure 4D:
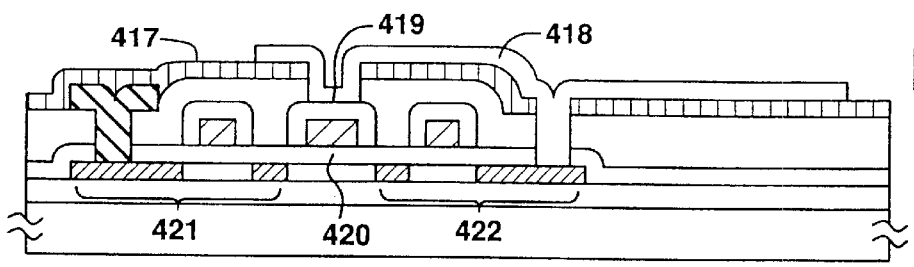
Figure 7A:
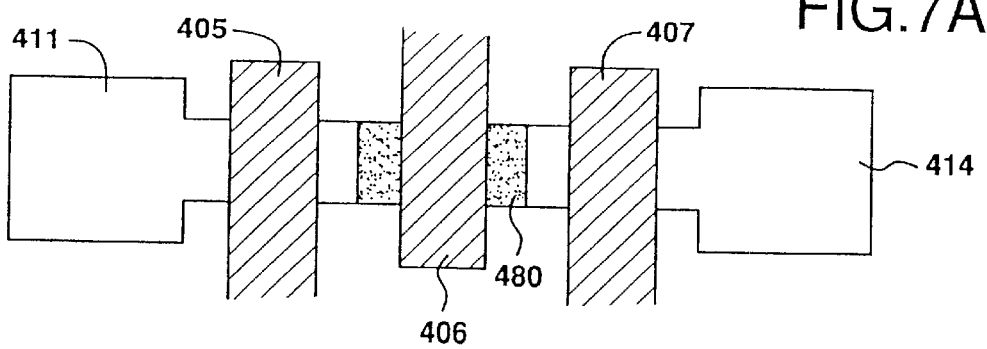
FIGS. 7(A)–7(D) are diagrams of arrangements and circuits comprising semiconductor regions and gates according to the invention.
Figure 7B:
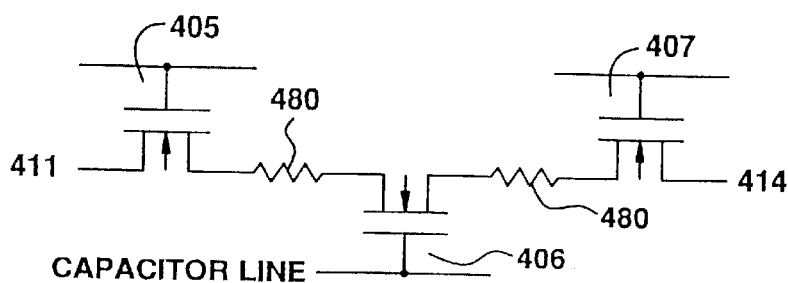

In order to introduce a resistor more positively, an impurity is introduced first at a high concentration (step illustrated in FIG. 4(B)) and then at a low concentration. If a lightly doped region 480 is formed only close to the gate electrode 406, especially desirable results are obtained. The lightly doped region has a higher sheet resistance than the other doped regions 411–114. Therefore, the circuit shown in FIG. 7(B) is obtained from the circuit (FIG. 7(A)) corresponding to the configuration in which another TFT is inserted in series between two TFTs as shown in FIG. 3(A) (FIGS. 7(A) and 7(B)).

Figure 7C:
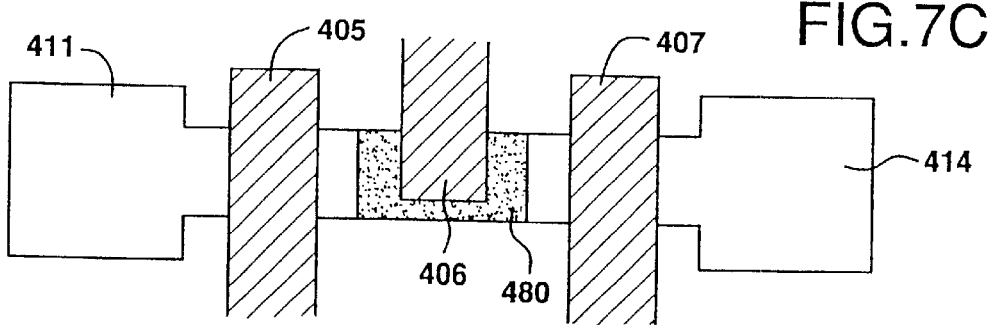
Figure 7D:
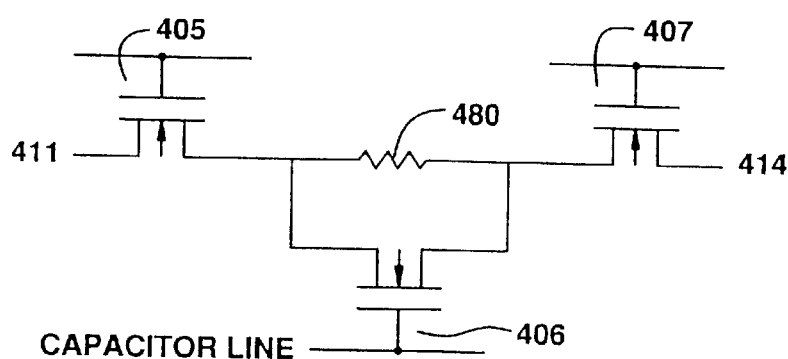

In the case of the circuit which corresponds to the configuration shown in FIG. 3(B) and in which a MOS capacitor is connected between two TFTs, the circuit shown in FIG. 7(D) is similarly derived (FIGS. 7(C) and 7(D)).

In any case, the resistor 480 serves to reduce the OFF current. In the present example, as many as three gates exist. However, only two contacts are needed. Since the capacitor is built, using multilevel metallization, the area occupied is narrow.

FIG. 3(A) shows standard TFTs. FIG. 3(B) shows standard MOS capacitors. Because the channel widths of TFTs used in active matrix circuit devices are generally small, it is difficult to secure sufficient capacitance unless the width of the gate 406 is made sufficiently large. In this case, the island region 403 is widened only in the portion of the MOS capacitor as shown in FIG. 3(C). Furthermore, the shape of the gate 406 may be modified as shown in FIG. 3(D).

Figure 8A:
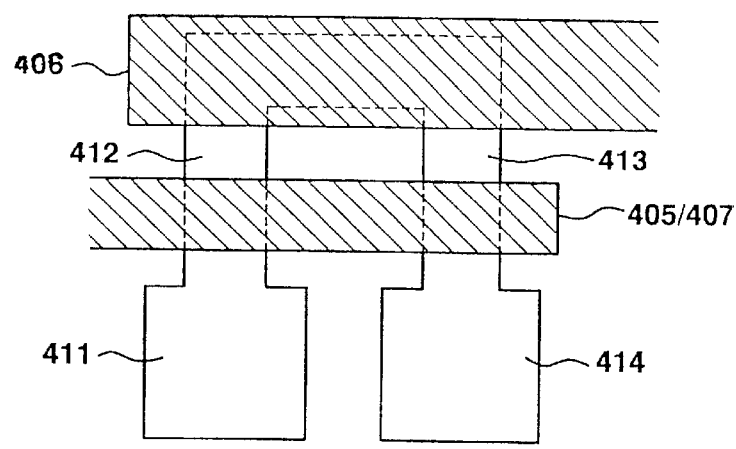
FIGS. 8(A)–8(C) are diagrams showing arrangements of semiconductor regions and gates according to the invention.
Figure 8B:
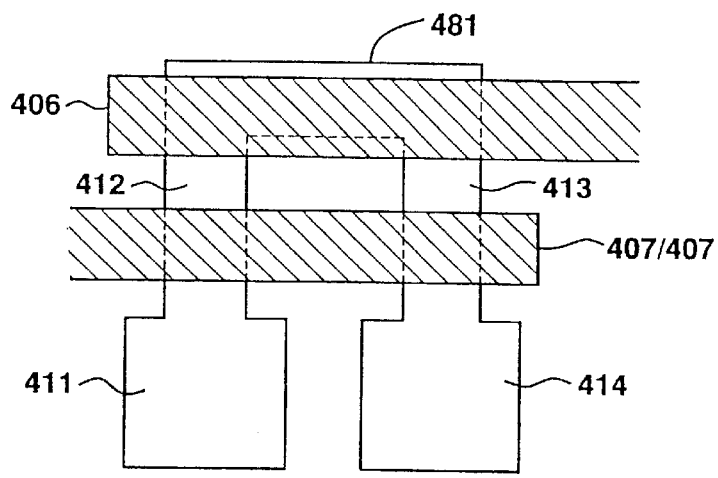
Figure 8C:
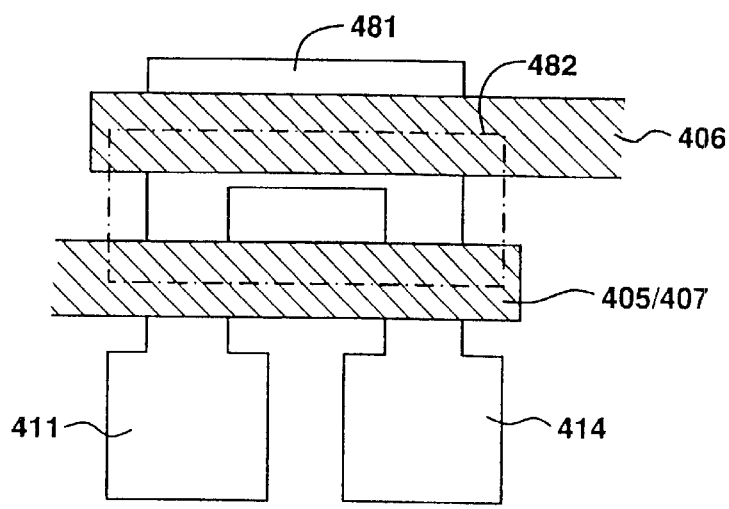

However, if sufficient capacitance cannot be obtained by the use of any of these methods, then the island region is changed into substantially U-shaped or horseshoe form, as shown in FIGS. 8(A)–8(C). A gate signal line and a capacitor line are made to overlap the U-shaped island region. That is, the semiconductor film overlaps the gate signal line, or gate electrodes 405 and 407, at two locations. The semiconductor film overlaps the capacitor line, or the gate electrode 406, at one location. The gate signal line is formed so as to extend parallel to the capacitor line. In this case, the gates 405 and 407 can be formed in line. This is advantageous to the layout.

In FIG. 8(A), the gate electrode 406 divides the semiconductor region and so the circuit is similar to the circuit shown in FIG. 3(A). The structure shown in FIG. 8(A) is characterized in that the semiconductor region has a region 411 in contact with an image signal line, a region 414 in contact with a pixel electrode, and two N- or P-type regions 412 and 413. These two regions 412 and 413 are separated by a capacitor line and a gate signal line.

If the capacitor line does not completely overlap the semiconductor film but an uncapped semiconductor region 481 is formed as shown in FIG. 8(B), then no problems take place. The requirement is that the regions 412 and 413 are separated by the gate signal line (i.e., gate electrodes 405 and 407) and the capacitor line (i.e., the gate electrode 406).

On the other hand, in FIG. 8(C), the semiconductor regions 412 and 413 are not divided by the gate electrode 406 and, therefore, the circuit is similar to the circuit shown in FIG. 3(B).

In this way, the device density can be enhanced mainly by devising the shape of the semiconductor film, or the active layer. If a switching device is built, using five TFTs as shown in FIG. 2(D), then the semiconductor film is shaped like the letter N or S. Row-selecting signal lines and gate signal lines are made to overlap this semiconductor film.

EXAMPLE 7

Figure 4E:
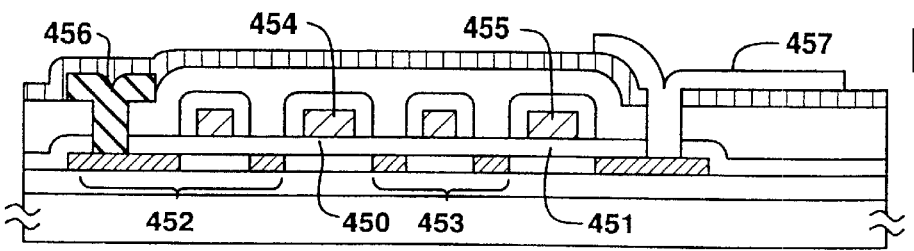

The present example is shown in FIG. 4(E) in cross section. In the present example, a gate 454 is formed between N-channel TFTs 452 and 453. A MOS capacitor 450 is formed between the gate 454 and the underlying silicon semiconductor. The capacitor 450 uses a gate-insulating film as a dielectric. Another gate 455 is formed between the TFT 453 and the contact of a pixel electrode 457 to create a MOS capacitor 451 similarly. A metal interconnect 456 is an extension to an image signal line.

In the present example, the first MOS capacitor 450 is formed between the TFTs 452 and 453. The second MOS capacitor 451 is formed between the pixel electrode 457 and the TFT 453. Therefore, the present example corresponds to the configuration shown in FIG. 1(*d*). In the present example, as many as four gates are present but only two contacts are necessary. Consequently, the area occupied can be made relatively small.

EXAMPLE 8

Figure 4F:
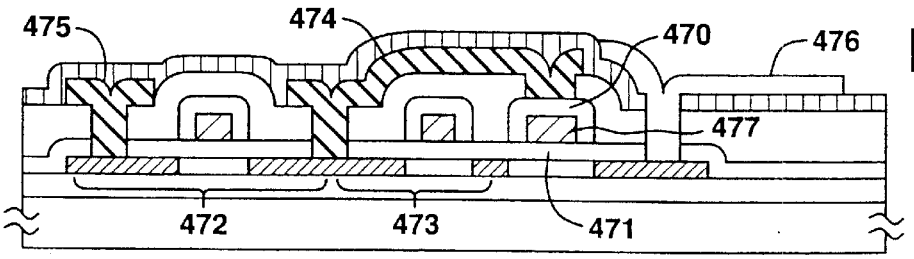
Figure 5A:
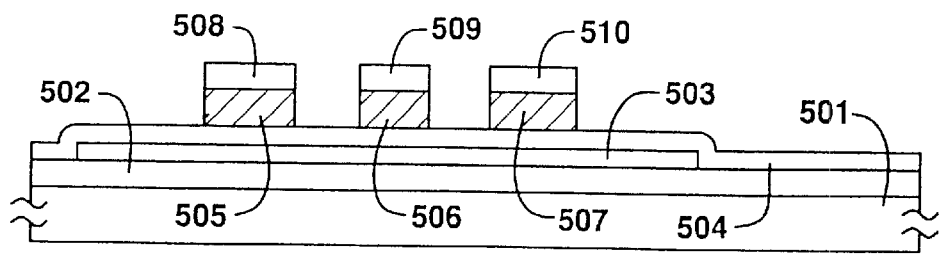
FIGS. 5(A)–5(E) are cross-sectional views of active matrix circuit devices according to the invention, illustrating the process sequence of another method of fabricating the circuit devices.
Figure 5B:
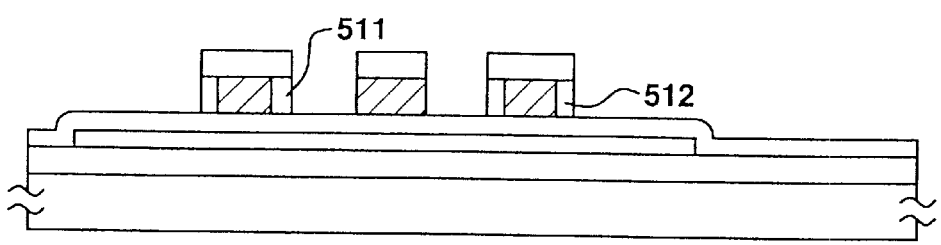
Figure 5C:
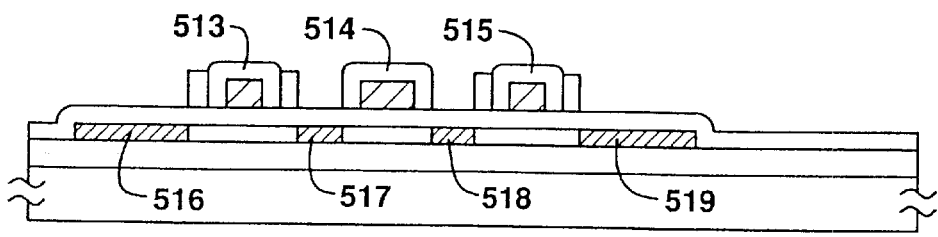
Figure 5D:
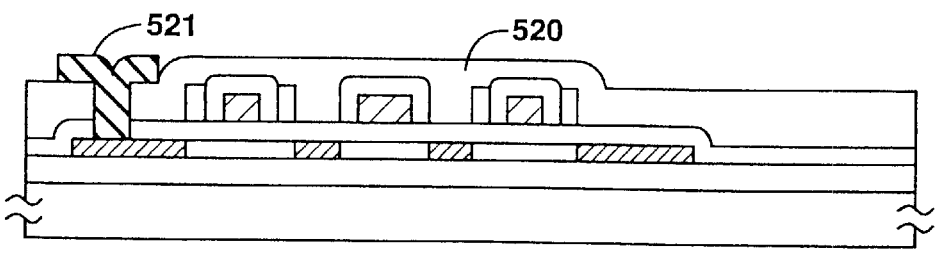
Figure 5E:
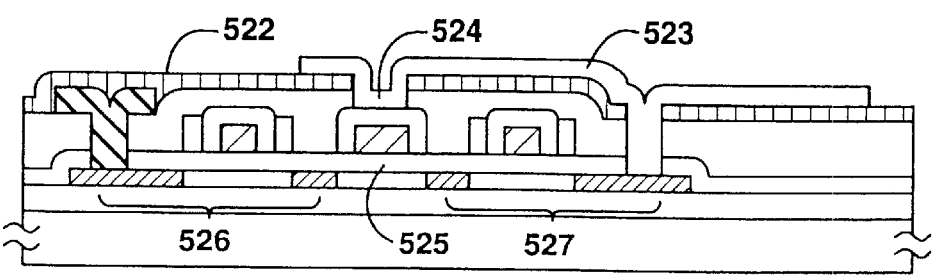

The present example is shown in FIG. 4(F) in cross section. In the present example, a metal interconnect 474 extends from the interface between N-channel TFTs 472 and 473. A gate 477 is formed between the TFT 473 and a pixel electrode 476. The metal interconnect 474 extends to the top surface of the gate 477. A capacitor 470 is formed, using an anodic oxide as a dielectric. Another MOS capacitor 471 is formed, using a gate-insulating film as a dielectric, the gate-insulating film being located between the gate 477 and an underlying silicon semiconductor layer. A metal interconnect 475 is an extension to the image signal line.

In the present example, a capacitor is created between the gate 471 of the MOS capacitor and the conductive interconnects 474 extending from the TFTs 472 and 473. Since the MOS capacitor is parallel to the pixel electrode 476, the configuration corresponds to the configuration shown in FIG. 1(*c*).

EXAMPLE 9

The process sequence of the present example is illustrated in FIGS. 5(A)–5(E). First, silicon oxide was deposited as a buffer layer 502 to a thickness of 2000 Å on a substrate 501. An island region 503 was formed out of a crystalline silicon film. A gate-insulating film 504 was formed on the island region 503.

Then, an aluminum film having a thickness of 5000 Å was formed by sputtering techniques. In order to improve the adhesion to photoresist at a porous anodic oxide film formation step carried out later, a thin anodic oxide film having a thickness of 100 to 400 Å was formed on the surface of the aluminum film.

Subsequently, a photoresist film having a thickness of about 1 μm was formed by spin coating. Gate electrodes 505, 506, and 507 were etched by a well-known photolithographical method. Masks of the photoresist 508, 509, and 510 were left on the gate-electrode (FIG. 5(A)).

Then, the laminate was immersed in an aqueous solution of 10% oxalic acid. The positive terminal of a regulated current source was connected to the gate electrodes 505 and 507 on the laminate. A platinum electrode was connected to the negative terminal. Under this condition, an anodization process was carried out. This technique is disclosed in Japanese Patent Laid-Open 338612/1994. At this time, the anodization was effected at a constant voltage of 5 to 50 V, e.g., 8 V, for 10 to 500 minutes, e.g., 200 minutes. As a result, a porous anodic oxide, 511 and 512, having a thickness of 5000 Å, was formed on the side surfaces of the gate electrodes 505 and 507. The obtained anodic oxide was. porous. Since a masking material, 508 and 510, existed on the top surfaces of the gate electrodes, anodization process hardly progressed. No anodic oxidation was formed on the gate electrode 506 because no current was passed through this electrode 506 (FIG. 5(B)).

Subsequently, the masking material was removed to expose the top surfaces of the gate electrodes. In the same way as in Example 6, L-tartaric acid was diluted with ethylene glycol to a concentration of 5%. The pH was adjusted to 7.0±0.2 with ammonia. An electrical current was passed through the gate. electrodes 505, 506, and 507 within the electrolytic solution to conduct an anodization process. Thus, an anodic oxidation having a thickness of 500 to 2500 Å, e.g., 2000 Å, was formed. In consequence, dense aluminum coating, 513, 514, and 515, having a thickness of 2000 Å was obtained.

Thereafter, an impurity (boron, in this example) was implanted into the island silicon region 503 by self-alignment techniques, using the gate electrode portion as a mask, to form a P-type doped region. In the present example, diborane ($B_2H_6$) was used as a dopant gas. The dose was $1\times10^{14}$ to $5\times10^{15}$ atoms/cm$^2$. The accelerating voltage was 40 to 90 kV. For example, the dose was $1\times10^{15}$ atoms/cm$^2$, and the accelerating voltage was 65 kV. As a result, P-type doped regions 516–519 were formed (FIG. 5(C)).

The laminate was irradiated with KrF excimer laser light having a wavelength of 248 nm and a pulse width of 20 nsec to activate the doped regions 516–519. Then, silicon oxide was deposited as an interlayer insulator film 520 having a thickness of 3000 Å by plasma-assisted CVD. The interlayer insulator film 520 and the gate-insulating film 504 were etched. Contact holes were created in the P-type doped region 516. Thereafter, an aluminum film was formed by sputtering techniques. The aluminum film was etched to form an image signal line 521 (FIG. 5(D)).

Then, a passivation film 522 was formed. The passivation film 522, the interlayer insulator film 520, and the gate-insulating film 504 were etched to form holes over the anodic oxide film 514 and to form contact holes in the P-type doped region 519, the contact-holes being used for contact with pixel electrodes. ITO was deposited as a film. This ITO film was etched to form a pixel electrode 523. This pixel electrode 523 was opposite to the gate electrode 506. Thus, a capacitor using the anodic oxide film 514 as a dielectric was created. If the P-type doped regions 517 and 518 are maintained at the same potential, a MOS capacitor is created between the gate electrode 506 and the underlying silicon semiconductor layer. This MOS capacitor uses the gate-insulating film 504 as a dielectric (FIG. 5(E)).

Active matrix circuit devices comprising the P-channel TFTs 526, 527, the capacitor 524, and the MOS capacitor 525 were formed by the manufacturing steps described thus far. In the present example, each pixel electrode forms a capacitor together with the gate of a MOS capacitor. Therefore, the circuit is similar to the circuits shown in FIGS. 1(*a*) and 1(*b*) except that the transistor conductivity type is reversed.

In the present example, the OFF currents of the TFTs 526 and 527 are required to be suppressed. These TFTs have larger offset widths than the TFTs of Example 6. On the other hand, the MOS capacitor needs no offset structure and so the offset width of the MOS capacitor is set to a small value.

EXAMPLE 10

FIGS. 9(A)–9(F) show the manner in which circuits are built according to the present invention. Well-known process techniques or the process techniques described in Example 6 or 9 may be used for this purpose and so these techniques will not be described in detail below.

First, substantially U-shaped or horseshoe semiconductor regions or active layers 601–604 were formed. Where the active layer 601 is used as a reference layer, the active layer 602 forms the same column and the next row. The active layer 603 forms the next column and the same row. The active layer 604 forms the next column and the next row (FIG. 9(A)).

Then, a gate-insulating film (not shown) was formed. Gate signal lines 605, 606 and capacitor lines 607, 608 were formed out of the gate-insulating film. The positional relations among the gate signal lines, the capacitor lines, and the active layers were the same as the positional relations shown in FIG. 8 (FIG. 9(B)).

After introducing an impurity into the active layers, contact holes (such as 611) were formed at the left ends of the active layers. Then, image signal lines 609 and 610 were created (FIG. 9(C)).

Then, pixel electrodes 612 and 613 were created in regions surrounded by the gate signal lines and the image signal lines. In this way, a TFT 614 was formed by the capacitor line 607 and the active layer 601. At this time, the capacitor line 607 did not overlap the pixel electrode 613 of the same row but overlapped the pixel electrode 612 of the immediately preceding row. That is, with respect to the pixel electrode 613, the capacitor line 608 of the immediately following row overlapped the pixel electrode 613, thus forming a capacitor 615. A constant voltage sufficient to operate the TFT 614 as another MOS capacitor was applied to the capacitor lines 607 and 608 in the same way as in the other examples (FIG. 9(D)).

Figure 9A:
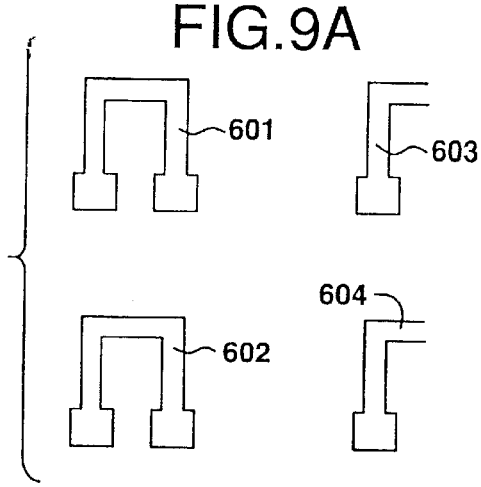
FIGS. 9(A)–9(F) are diagrams showing arrangements of pixel electrodes and other components according to the invention.
Figure 9B:
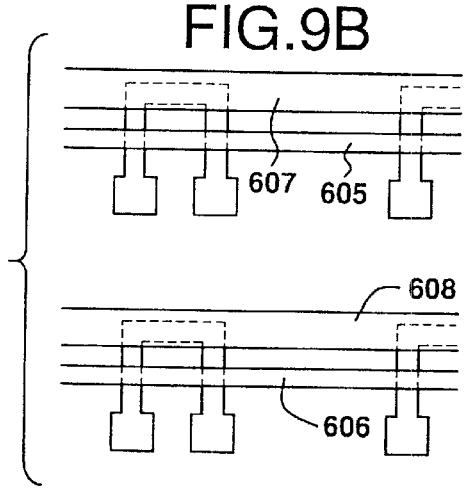
Figure 9C:
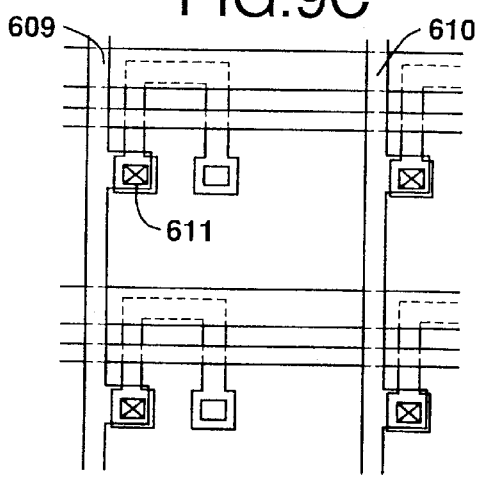
Figure 9D:
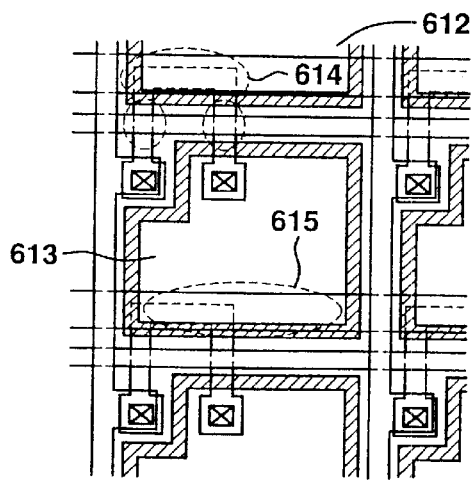
Figure 9E:
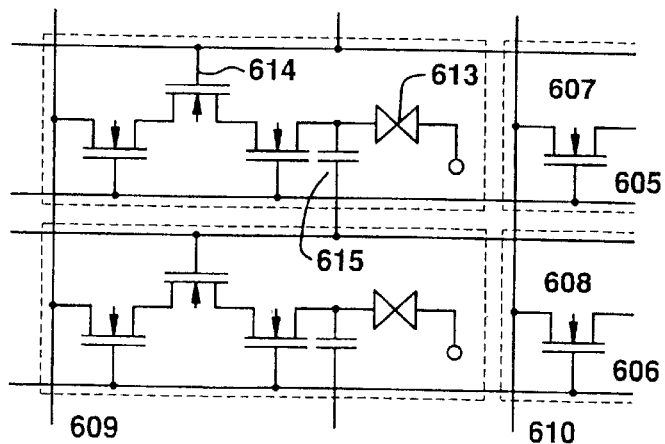

In this way, the gate signal line was laid to overlap the pixel electrode of the immediately preceding or following row. Thus, a circuit as shown in FIG. 9(E) was created. The capacitor 615 corresponds to the capacitor 104 shown in FIG. 1(A). A capacitor. can be added without substantially lowering the aperture ratio. This is effective in enhancing the device density.

Figure 2A:
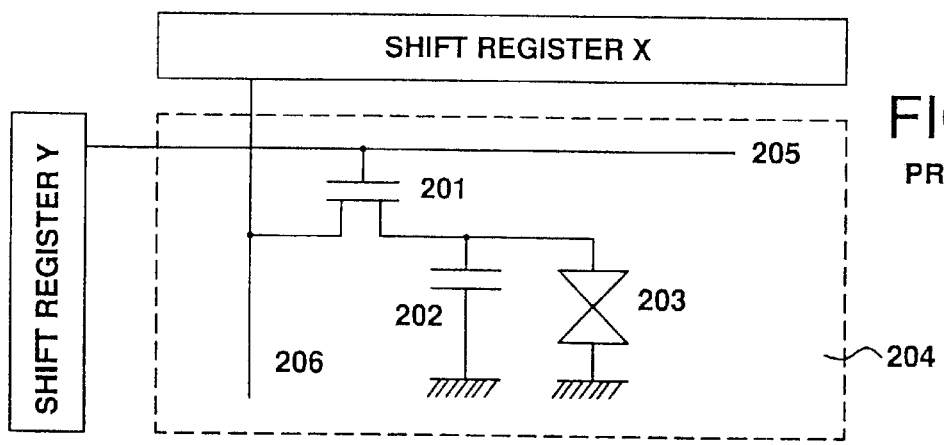
FIG. 2(A) is a fragmentary schematic circuit diagram of the prior art active matrix circuit.
Figure 2B:
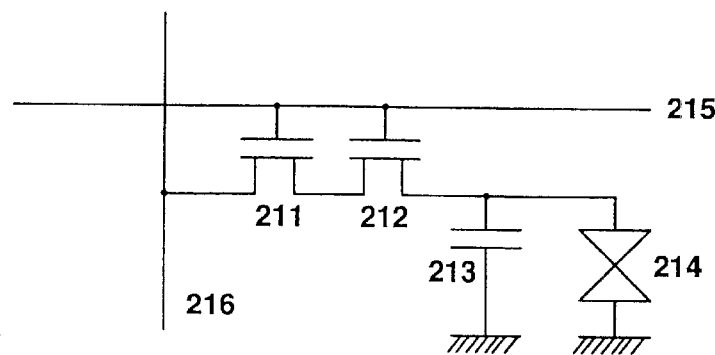
FIGS. 2(B)–2(D) are fragmentary schematic circuit diagrams of active matrix circuits according to the invention.
Figure 9F:
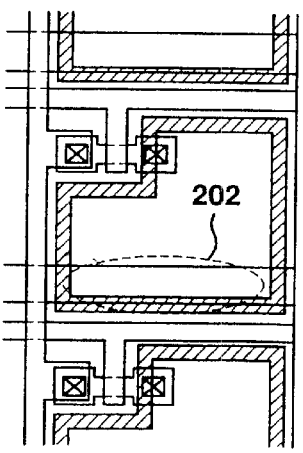

For reference, FIG. 9(F) shows prior art unit pixel (see FIG. 2(A)) formed in a region surrounded by row-selecting signal lines and image signal lines which are regularly spaced from each other. The region shielded by the auxiliary capacitor 202 is the same as the region of the present example (FIG. 9(D)). In the present example, the semiconductor region 601 is almost totally covered with the signal lines 605 and 607. Consequently, the aperture ratio does not decrease. On the other hand, in the prior art structure (FIG. 9(F)), gate electrodes branching from the row-selecting signal lines deteriorate the aperture ratio.

The circuit arrangement and other features of the present example are as follows.

(1) Those portions of the semiconductor region 601 which make connections with the image signal lines and with the pixel electrodes are located on the same side as the gate signal line 605.

(2) The capacitor line 607 is located on the opposite side of the gate signal line 605.

(3) The adjacent pixel electrode 612 overlaps the capacitor line 607 of the same row but does not overlap the image signal line 609 or 610.

With respect to the relation of the switching devices of an active matrix circuit to pixel electrodes, the pixel electrodes should not overlap any region to which an image signal is applied. This requirement is satisfied because of the features described above. Furthermore, the aperture ratio can be enhanced.

EXAMPLE 11

FIGS. 10(A)–10(F) illustrate the process sequence of the present example. First, silicon oxide was deposited as a buffer layer 702 to a thickness of 2000 Å on a substrate 701. Island regions 703 were formed out of a crystalline silicon film. A gate-insulating film 704 was formed on the island regions.

Then, gate electrodes 705–707 consisting mainly of aluminum and coated with a barrier type anodic oxide were formed by the use of techniques similar to the techniques used in Example 9. In the present example, a porous anodic oxide 708 was deposited on the side surfaces of only the central gate electrode (FIG. 10(A)).

The gate-insulating film 704 was etched by dry etching. As a result, the gate-insulating film was left on those portions 709–711 which were located under the gate electrodes 705–707 and under their respective anodic oxide portions (FIG. 10(B)).

Thereafter, the porous anodic oxide 708 was selectively removed. Techniques for this manufacturing step are disclosed in the above-cited Japanese Patent Laid-Open No. 338612/1994 (FIG. 10(C)).

Subsequently, an impurity (phosphorus, in this example) was implanted into the island silicon regions 703 by self-alignment techniques, using the gate electrode portion and the gate-insulating film 710 as a mask, to form an N-type doped region. In the present example, this ion implantation process consisted substantially of two steps. In the first step, the impurity was implanted at a high accelerating voltage and at a low dose. In the second step, the impurity was implanted at a low accelerating voltage and at a high dose. In an example of the first step, the accelerating voltage was 80 kV, and the dose was $1 \times 10^{13}$ atoms/cm$^2$. In an example of the second step, the accelerating voltage was 20 kV, and the dose was $5 \times 10^{14}$ atoms/cm$^2$.

In the first step, a high accelerating energy can be imparted to ions. Therefore, ions can be implanted through the gate-insulating film 710. The doped regions formed at this time are lightly doped. In the second step, heavily doped regions can be formed but it is impossible to introduce ions through the gate-insulating film 710. As a result, heavily doped N-type regions 712–715 and lightly-doped N-type regions 716, 717 could be separately formed (FIG. 10(D)).

After activating the doped regions 712–717 formed in this way, a silicon oxide film 718 was formed as an interlayer insulator film to a thickness of 3000 Å by plasma-assisted CVD. The interlayer insulator film 718 was etched, and contact holes were formed in the heavily doped N-type regions 712. Then, an aluminum film was formed by sputtering techniques. The aluminum film was etched to form image signal lines 719.

Then, a passivation film 720 was formed. The passivation film 720 and the interlayer insulator film 718 were etched to form contact holes in the heavily doped N-type region 715, the contact holes being used for connection with pixel electrodes. An ITO film was formed and etched to form pixel electrodes 721 (FIG. 10(E)).

A circuit as shown in FIG. 10(F) could be obtained by the fabrication steps described thus far. This can be used as a capacitor by maintaining the gate electrode 706 at an appropriate potential. The lightly doped N-type regions 716 and 717 act as resistors inserted in series with TFTs and are effective in reducing the OFF current (FIG. 10(E)).

EXAMPLE 12

Figure 11A:
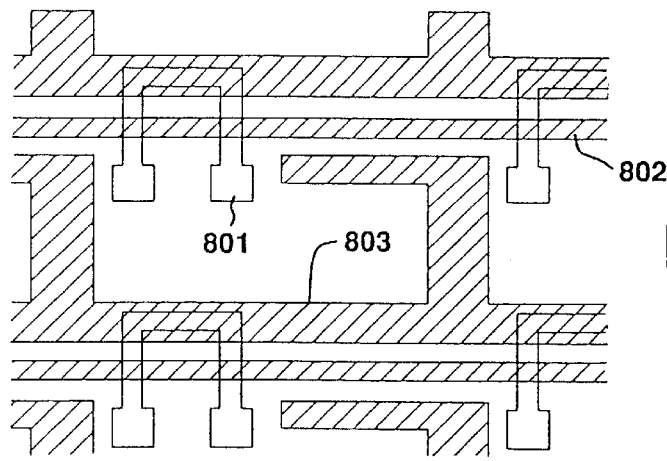
FIGS. 11(A)–11(C) are diagrams showing arrangement of pixel electrodes and other components according to the invention.
Figure 11B:
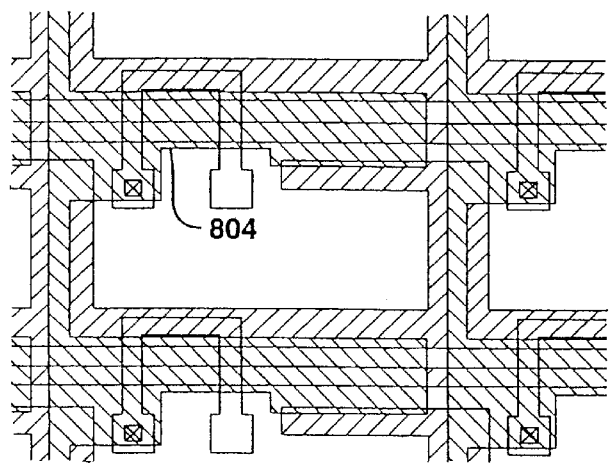
Figure 11C:
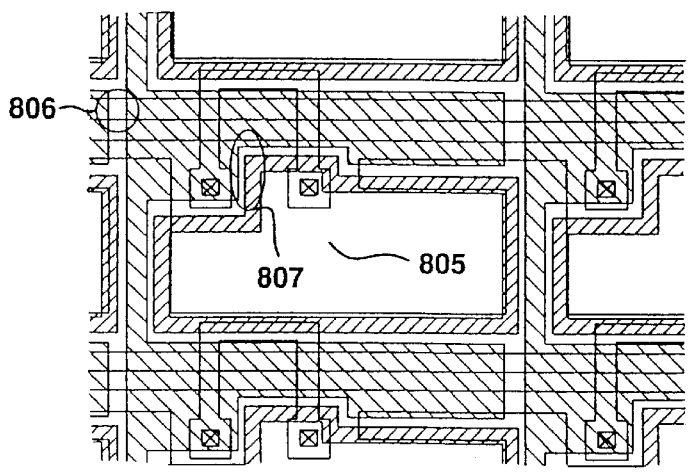

FIGS. 11(A)–11(C) show the manner in which circuits are built according to the present invention. Well-known process techniques or the process techniques described in Example 6 or 9 may be used for this purpose and so these techniques will not be described in detail below. The concept of the circuit arrangement of the present example is essentially the same as the concept of Example 10 (FIGS. 9(A)–9(F)). However, in the present example, TFTs are protected against extraneous light by making positive use of shielding of capacitor lines and image signal lines which are formed out of a shielding film. A black matrix circuit is built from the TFTs to clearly distinguish colors among pixels.

The process sequence is the same as the sequence used in Example 10. First, a substantially U-shaped active layer 801 was formed. Then, a gate-insulating film (not shown) was deposited on the active layer. Gate signal lines 802 and capacitor lines 803 were formed. The capacitor lines were arranged so as to surround the portion where pixel electrodes were formed as shown in FIG. 11(A).

After implanting an impurity into the active layer, contact holes were formed at the left end of the active layer. Also, an image signal line 804 was formed. This image signal line was also so arranged as to cover the surroundings of the pixel electrodes (especially, the surroundings of TFTs) (FIG. 11(B)).

As can be seen from the figure, the transparent portions are only the central portion in which the pixel electrodes are formed and two dot-like portions located at the top right end of each pixel. In these dot-like portions, the gaps between the gate signal lines and the capacitor lines are not filled up with the image signal lines. The other portions are shielded against light by the gate signal lines, the capacitor lines, and the image signal lines. Especially, in the present example, the image signal lines are arranged on the TFTS. These image signal lines prevent extraneous light from entering the TFTs. This is effective in stabilizing the characteristics of the TFTs.

Then, a pixel electrode 805 was formed in the above-described central portion. The transparent regions excluding the pixel electrode were only the gap 807 between the pixel electrode 805 and the image signal line 804 and the gap 806 among the gate signal line 802, the capacitor line 803, and the image signal line 804. The gap 807 was necessary to prevent the image signal line from overlapping the pixel electrode. The gap 806 was needed to separate the adjacent image signal lines. However, these gaps 807 and 806 have sufficiently small areas.

A structure equivalent to a black matrix could be obtained, using existing conductive interconnects without forming a black matrix (FIG. 11(C)).

Figure 12:
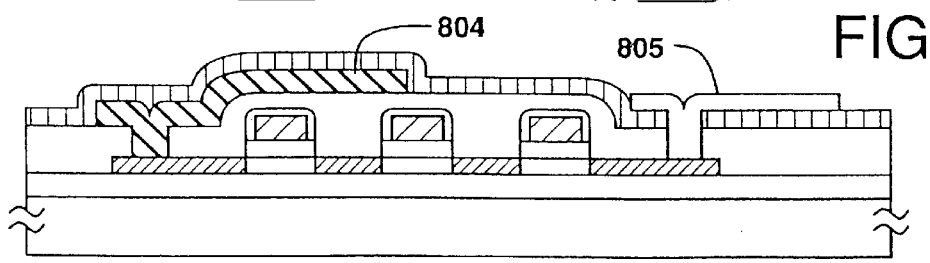
FIG. 12 is a cross-sectional view of active matrix circuit devices according to the invention.

The cross section of TFT portions of the present example is conceptually shown in FIG. 12. As shown, a TFT located on the side of an image signal line 804 is totally coated with the image signal line 804. A TFT located in the center is partially coated with the image signal line 804. In the present example, capacitor lines often overlap pixel electrodes and image signal lines. Therefore, sufficient care must be exercised in providing insulation between metallization layers. The insulation can be effectively enhanced by forming an anodic oxide film at least on the top surfaces of capacitor lines (FIG. 12).

EXAMPLE 13

Figures 13A, 13B:
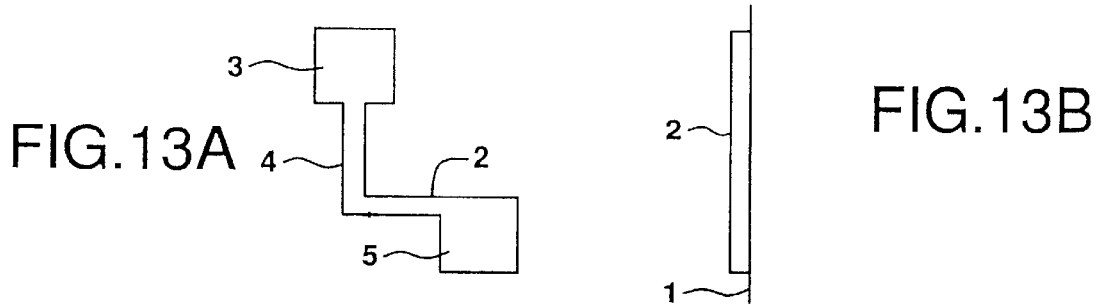
FIG. 13 is a top view and a cross-sectional view of a TFT, illustrating a manufacturing step for fabricating the TFT according to the invention.
Figures 14A, 14B:
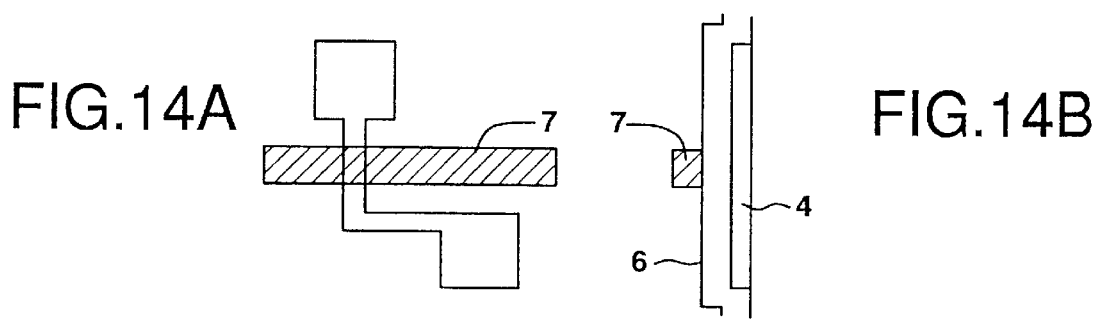
FIG. 14 is a top view and a cross-sectional view of another TFT, illustrating a manufacturing step for fabricating the TFT according to the invention.

The present example is illustrated in FIGS. 13 and 14. An appropriate insulating film may or may not be formed as a buffer layer on a dielectric surface 1 of a substrate. First, an island-shaped thin-film silicon region 2 having a thickness of 100 to 1500 Å, e.g., 800 Å, was formed either on the substrate or on the dielectric surface 1. As shown in FIG. 13, the silicon region 2 had pads 3, 5 for formation of contacts and an intervening channel formation portion 4. The silicon region can be made of either amorphous silicon or polycrystalline silicon (FIG. 13).

Then, a gate-insulating film 6 was formed out of silicon oxide to a thickness of 1200 Å. An appropriate amount of phosphorus was added to the polysilicon film to improve its conductivity. This polysilicon film was formed to a thickness of 3000 Å by LPCVD. This polysilicon film was etched to form a gate line 7. The material of the gate line is not limited to polysilicon. For example, metal materials such as aluminum and tantalum can also be employed. Especially, where aluminum is used, the sheet resistance of the gate line can be effectively lowered (FIG. 14).

Figures 15A, 15B:
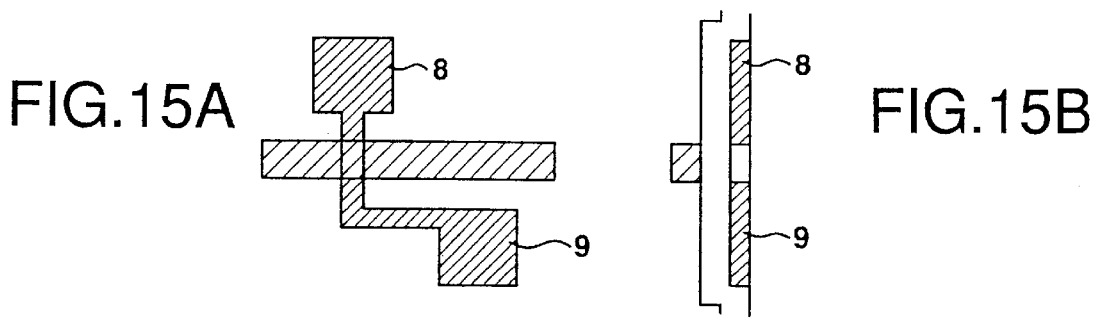
FIG. 15 is a top view and a cross-sectional view of a further TFT, illustrating a manufacturing step for fabricating the TFT according to the invention.

Thereafter, an impurity (phosphorus, in this example) was introduced into the island-shaped silicon region 2 by self-aligned ion implantation techniques, using the gate line 7 as a mask. In this manner, doped regions 8 (source) and 9 (drain) were created. At this time, no doped region was formed under the gate electrode. Rather, a channel 4 was created. After the ion implantation, the introduced dopant might be activated by appropriate means such as thermal annealing or laser annealing (FIG. 15).

Figures 16A, 16B:
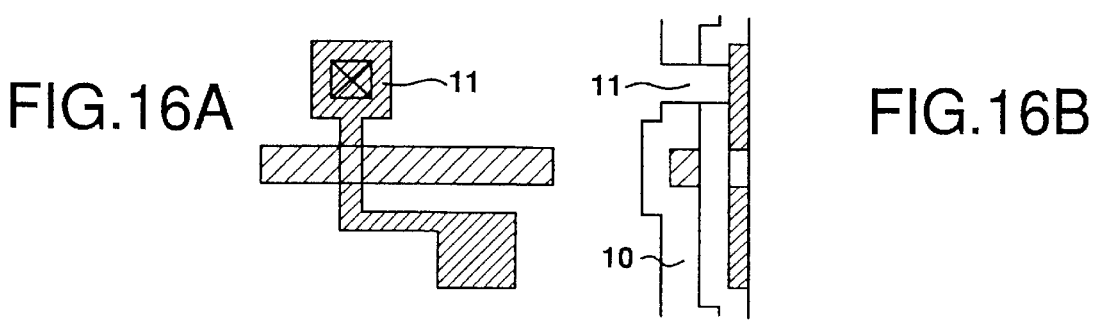
FIG. 16 is a top view and a cross-sectional view of a yet other TFT, illustrating a manufacturing step for fabricating the TFT according to the invention.

Then, a film of silicon oxide or silicon nitride 10 having a thickness of 2000 to 10000 Å, e.g., 5000 Å, was formed by plasma-assisted CVD. In this way, a first interlayer insulator layer was formed. A contact hole 11 extending to a pad 3 was formed, the pad 3 being used for contact with the silicon region (FIG. 16).

Figure 17A:
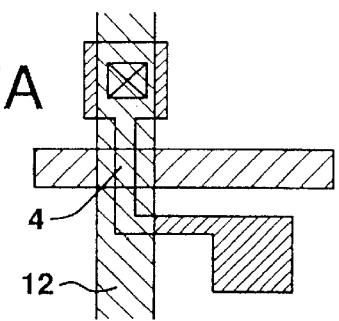
FIG. 17 is a top view and a cross-sectional view of a yet further TFT, illustrating a manufacturing step for fabricating the TFT according to the invention.
Figure 17B:
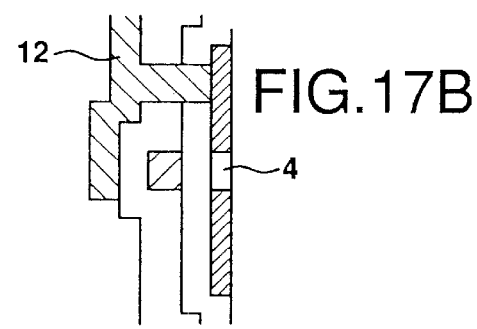

Subsequently, an aluminum film having a thickness of 5000 Å was formed by sputtering techniques. The aluminum film was etched to form a source line 12. In the contact hole 11 formed at the previous manufacturing step, the source line 12 formed a contact with a source 8 (FIG. 17).

Figure 18A:
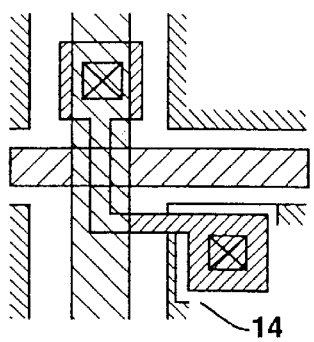
FIG. 18 is a top view and a cross-sectional view of a still other TFT, illustrating a manufacturing step for fabricating the TFT according to the invention.
Figure 18B:
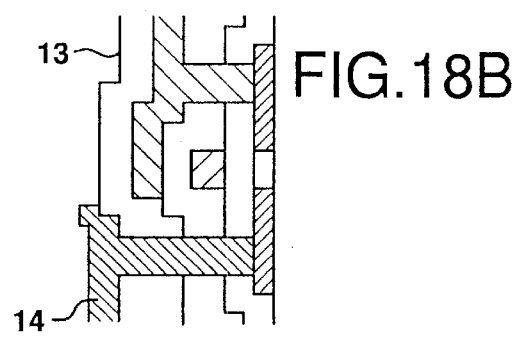

Then, silicon nitride or silicon oxide was deposited as a second interlayer insulator layer 13 to a thickness of 2000 to 5000 Å, e.g., 000 Å. A contact hole extending to a pad 5 was formed in the second interlayer insulator layer 13, the pad 5 being used for contact with an island silicon region. An ITO film having a thickness of 1000 Å was formed by sputtering techniques. The ITO film was etched to form a pixel electrode 14 (FIG. 18).

Figure 19A:
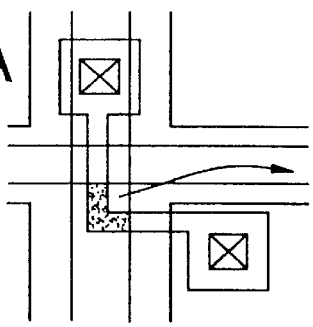
FIG. 19 is a top view and a circuit diagram of an additional TFT, illustrating a manufacturing step for fabricating the TFT according to the invention.
Figure 19B:
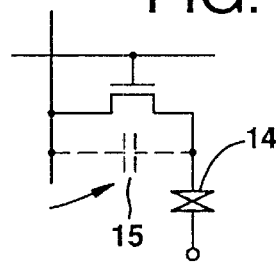
Figure 22:
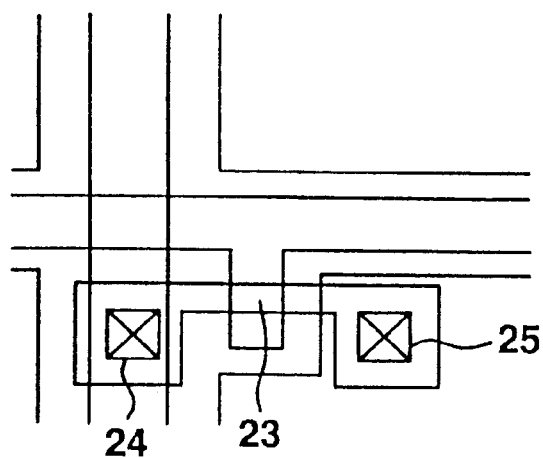
FIG. 22 is a circuit diagram illustrating another conventional arrangement of TFTs.

In the present example, the direction of channel in the TFT (directed from the source to the drain) is parallel to the source line as shown in FIG. 19. This is a feature compared with the prior art TFT shown in FIG. 22.

In the present and other examples of the present invention, the channel 4 is located under the source line 12. The source and drain adjacent to the channel 4 overlap with the source line, thus forming a parasitic capacitor, unlike the prior art TFT. A parasitic capacitor 15 formed between the drain 9 and the source line 12 presents a problem during operation of the active matrix circuit. However, as can be seen from FIG. 18, the drain 9 and the source line 12 are isolated from each other by the first interlayer insulator 10. The width of the island silicon region where an overlap is formed can be made sufficiently small. This overlap is sufficiently smaller than the area of the pixel electrode 14. For these and other reasons, the image displayed is not greatly affected.

EXAMPLE 14

Figure 20A:
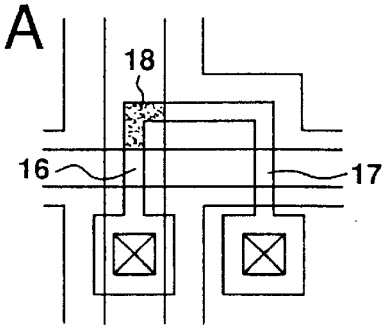
FIG. 20 is a top view and a circuit diagram of a still further TFT, illustrating a manufacturing step for fabricating the TFT according to the invention.
Figure 20B:
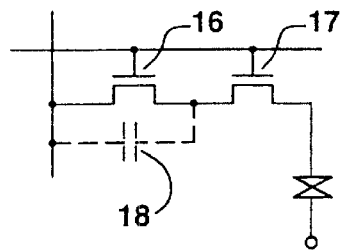
Figure 21:
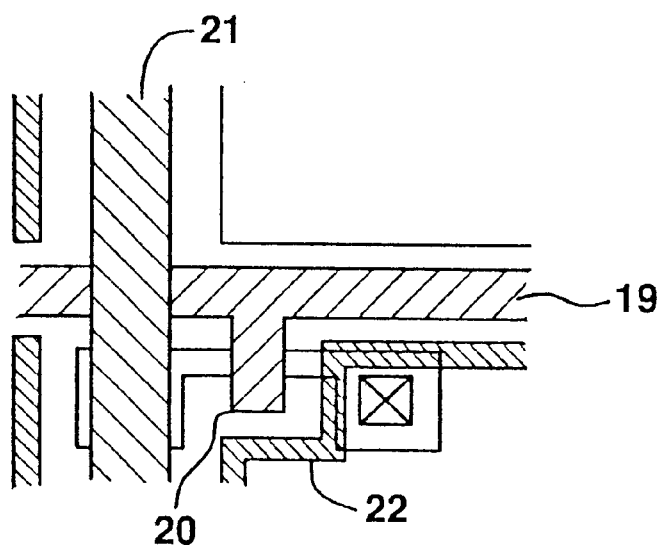
FIG. 21 is a circuit diagram showing a conventional arrangement of TFTS.

The present example is illustrated in FIG. 20. The process sequence is the same as the process sequence of Example 13.

In the present example, each island silicon region was shaped into a substantially U-shaped form. Gate lines were formed so as to intersect the silicon region. Consequently, two channels, or TFTs, 16 and 17 were formed. One end of the island silicon region was brought into contact with the source line. The source line was formed over the channel 16. The other end was brought into contact with a pixel electrode.

More specifically, in the present example, two TFTs connected in series are formed for each one pixel, as shown in FIG. 20. It is known that in this structure, leakage current from the pixel can be reduced, as disclosed in Japanese Patent Publication No. 38755/1991. In the present example, it is not necessary to form branch lines extending from gate lines, unlike the prior art techniques. Therefore, the area occupied by TFTs can be reduced. Furthermore, the aperture ratio can be enhanced.

Also in the present example, the drain of the left TFT acting also as the source of the right TFT overlaps the source line, thus forming a parasitic capacitor 18. In the present example, one TFT is added between the parasitic capacitor 18 and the pixel electrode, compared with Example 1. Consequently, the effect is limited (FIG. 20).

Figure 2C:
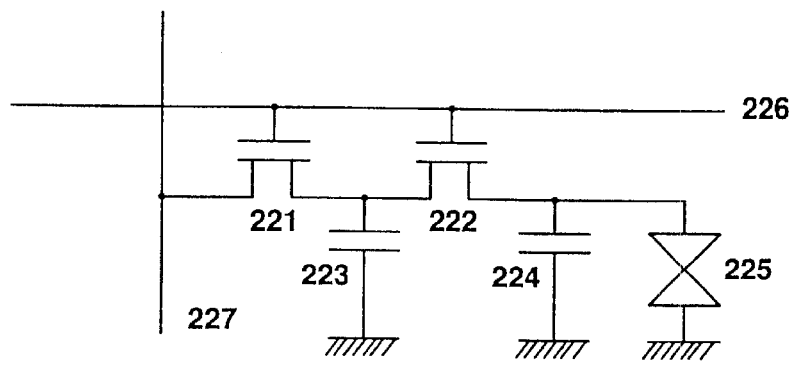
Figure 2D:
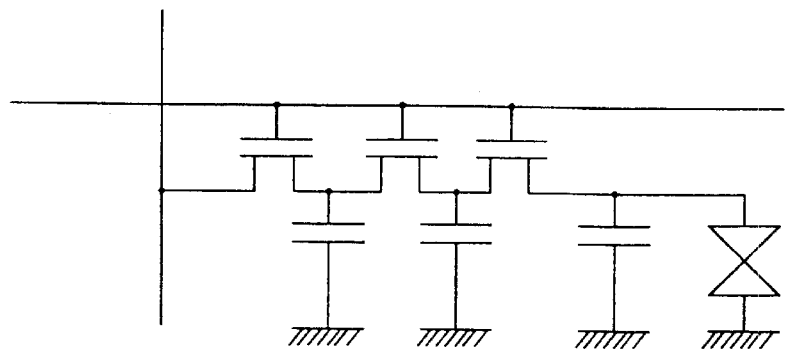

As described thus far, the drop of voltage developed across a liquid crystal cell can be successfully suppressed by connecting plural TFTs and/or an appropriate capacitor. In the present invention, especially in the TFT 222 shown in FIG. 2(C), the voltage developed between the source and drain is maintained at a low level throughout the driving process. Generally, deteriorations of TFTs depend on the voltage developed between the source and drain. The deteriorations can be prevented by making use of the present invention.

The present invention can be advantageously used in applications where images are required to be displayed at higher quality. That is, where quite large number of color tones of more than 256 gray levels are represented, it is necessary that electric discharge in the liquid crystal cell be suppressed within 1% during one frame. None of the conventional systems illustrated in FIGS. 2(A) and 2(B), respectively, are suitable for this purpose.

The present invention is especially adapted for an active matrix display using TFTs comprising a crystalline silicon semiconductor, the active matrix display being suitable for active matrix addressing, especially where the number of rows of picture elements is large. Generally, in a matrix display having a large number of rows, each row is activated for a short time. Therefore, TFTs of crystalline silicon semiconductor are not suitable for this matrix display. However, TFTs using crystalline silicon semiconductor suffer from large OFF current. For this reason, the present invention can contribute to this technical field because the invention can suppress the OFF current. Of course, TFTs comprising amorphous silicon semiconductor are employed to advantage.

In the illustrated examples, TFTs and MOS capacitors are mainly of the top gate type. The invention can be applied with similar utility to the bottom gate type and other structures. Additionally, a switching device comprising a combination of the top gate type and the bottom gate type may be used.

The present invention can enhance the aperture ratio of an active matrix circuit. In consequence, the display characteristics of an electrooptical device using this active matrix circuit can be improved. In this way, the present invention is industrially advantageous.

What is claimed is:

1. A liquid crystal device comprising:
a plurality of source lines over a substrate;
a plurality of gate lines over said substrate extending across said plurality of the source lines; and
a plurality of pixels over said substrate arranged in a matrix array at intersections of said source lines and gate lines, each of said pixels comprising:
at least first and second thin film transistors wherein a source or drain of said first thin film transistor is connected to one of said source lines;
a pixel electrode connected to a source or drain of said second thin film transistor wherein said first and second thin film transistors are electrically connected in series between said pixel electrode and said one of the source lines;
wherein a portion of said one of the source lines covers at least a channel region of said first thin film transistor so that said first transistor is light shielded while said second thin film transistor is not covered by any portion of said one of the source lines, and
wherein a width of said source lines is larger than a width of said channel region of said first thin film transistor, said width of said channel region taken along a direction perpendicular to a current flow direction of said channel region.

2. A display device according to claim 1 wherein each of said first and second thin film transistors has a top gate structure or a bottom gate structure.

3. A display device according to claim 1 wherein each of said first and second thin film transistors has a channel region comprising polysilicon.

4. The liquid crystal device according to claim 1 wherein said pixel electrode is formed on a different layer than said plurality of source lines.

5. A display device comprising:
a plurality of source lines over a substrate;
a plurality of gate lines over said substrate extending across said plurality of the source lines; and
a plurality of pixels over said substrate arranged in a matrix array at intersections of said source lines and gate lines, each of said pixels comprising:
at least first and second thin film transistors wherein one of a source or drain of said first thin film transistor is connected to one of said source lines;
a pixel electrode connected to a source or drain of said second thin film transistor wherein said first and second thin film transistors are electrically connected in series between said pixel electrode and said one of the source lines;
wherein a portion of said one of the source lines covers at least a portion of said first thin film transistor so that (1) the source or drain of said first thin film transistor which is connected to said one of the source lines and (2) at least a part of a channel of said first thin film transistor are light shielded while both of (1) the source or drain of said second thin film transistor which is connected to the pixel electrode and (2) a channel of said second thin film transistor, are not covered by any portion of said one of the source lines, and
wherein a width of said source lines is larger than a width of said channel region of said first thin film transistor, said width of said channel region taken along a direction perpendicular to a current flow direction of said channel region.

6. A display device according to claim 5 wherein each of said first and second thin film transistors has a top gate structure or a bottom gate structure.

7. A display device according to claim 5 wherein each of said first and second thin film transistors has a channel region comprising polysilicon.

8. A display device according to claim 5 wherein said display device is a liquid crystal display device.

9. The display device according to claim 5 wherein said pixel electrode is formed on a different layer than said plurality of source lines.

10. A liquid crystal device comprising:
   a plurality of source lines over a substrate;
   a plurality of gate lines over said substrate extending across said plurality of the source lines; and
   a plurality of pixels over said substrate arranged in a matrix array at intersections of said source lines and gate lines, each of said pixels comprising:
      at least first and second thin film transistors wherein a source or drain of said first thin film transistor is connected to one of said source lines;
      a pixel electrode connected to a source or drain of said second thin film transistor wherein said first and second thin film transistors are electrically connected in series between said pixel electrode and said one of the source lines; and
      a storage capacitor electrically connected to said second thin film transistor;
   wherein a portion of said one of the source lines covers at least a channel region of said first thin film transistor so that said first transistor is light shielded while said second thin film transistor is not covered by any portion of said one of the source lines, and
   wherein a width of said source lines is larger than a width of said channel region of said first thin film transistor, said width of said channel region taken along a direction perpendicular to a current flow direction of said channel region.

11. A display device according to claim 10 wherein each of said first and second thin film transistors has a top gate structure or a bottom gate structure.

12. A display device according to claim 10 wherein each of said first and second thin film transistors has a channel region comprising polysilicon.

13. The liquid crystal device according to claim 10 wherein said pixel electrode is formed on a different layer than said plurality of source lines.

14. A display device comprising:
   a plurality of source lines over a substrate;
   a plurality of gate lines over said substrate extending across said plurality of the source lines; and
   a plurality of pixels over said substrate arranged in a matrix array at intersections of said source lines and gate lines, each of said pixels comprising:
      at least first and second thin film transistors wherein a source or drain of said first thin film transistor is connected to one of said source lines;
      a pixel electrode connected to a source or drain of said second thin film transistor wherein said pixel electrode is electrically connected to said one of the source lines through at least said first and second thin film transistors; and
   wherein a portion of said one of the source lines covers said first thin film transistor so that said first transistor is light shielded while both of (1) the source or drain of said second thin film transistor which is connected to the pixel electrode and (2) a channel of said second thin film transistor, are not covered by any portion of said one of the source lines, and
   wherein a width of said source lines is larger than a width of said channel region of said first thin film transistor, said width of said channel region taken along a direction perpendicular to a current flow direction of said channel region.

15. A display device according to claim 14 wherein each of said first and second thin film transistors has a top gate structure or a bottom gate structure.

16. A display device according to claim 14 wherein each of said first and second thin film transistors has a channel region comprising polysilicon.

17. A display device according to claim 14 wherein said display device is a liquid crystal display device.

18. The display device according to claim 14 wherein said pixel electrode is formed on a different layer than said plurality of source lines.

19. A projection device having a liquid crystal device, said liquid crystal device comprising:
   a plurality of source lines over a substrate;
   a plurality of gate lines over said substrate in an orthogonal relation to said plurality of the source lines; and
   a plurality of pixels over said substrate arranged in a matrix array at intersections of said source lines and gate lines, each of said pixels comprising:
      at least first and second thin film transistors wherein a source or drain of said first thin film transistor is connected to one of said source lines;
      a pixel electrode connected to a source or drain of said second thin film transistor wherein said first and second thin film transistors are electrically connected in series between said pixel electrode and said one of the source lines;
   wherein a portion of said one of the source lines covers at least a portion of a channel region of said first thin film transistor so that said first transistor is light shielded while said second thin film transistor is not covered by any portion of said one of the source lines, and
   wherein a width of said source lines is larger than a width of said channel region of said first thin film transistor, said width of said channel region taken along a direction perpendicular to a current flow direction of said channel region.

20. A projection device according to claim 19 wherein each of said first and second thin film transistors has a top gate structure or a bottom gate structure.

21. A projection device according to claim 19 wherein each of said first and second thin film transistors has a channel region comprising polysilicon.

22. The liquid crystal device according to claim 19 wherein said pixel electrode is formed on a different layer than said plurality of source lines.

23. A projection device having a liquid crystal device, said liquid crystal device comprising:
   a plurality of source lines over a substrate;
   a plurality of gate lines over said substrate extending across said plurality of the source lines; and
   a plurality of pixels over said substrate arranged in a matrix array at intersections of said source lines and gate lines, each of said pixels comprising:
      at least first and second thin film transistors wherein a source or drain of said first thin film transistor is connected to one of said source lines;
      a pixel electrode connected to a source or drain of said second thin film transistor wherein said first and second thin film transistors are electrically connected in series between said pixel electrode and said one of the source lines;

wherein a portion of said one of the source lines covers said first thin film transistor so that (1) the source or drain of said first transistor which is connected to said one of the source lines and at least a part of a channel of said first transistor are light shielded while both of (1) the source or drain of said second thin film transistor which is connected to the pixel electrode and (2) a channel of said second thin film transistor, are not covered by any portion of said one of the source lines, and wherein a width of said source lines is larger than a width of said channel region of said first thin film transistor, said width of said channel region taken along a direction perpendicular to a current flow direction of said channel region.

24. A projection device according to claim 23 wherein each of said first and second thin film transistors has a top gate structure or a bottom gate structure.

25. A projection device according to claim 23 wherein each of said first and second thin film transistors has a channel region comprising polysilicon.

26. The liquid crystal device according to claim 23 wherein said pixel electrode is formed on a different layer than said plurality of source lines.

* * * * *